US012684916B2

(12) United States Patent
Oh et al.

(10) Patent No.: US 12,684,916 B2
(45) Date of Patent: Jul. 14, 2026

(54) DISPLAY DEVICE AND METHOD FOR MANUFACTURING SAME

(71) Applicant: SAMSUNG ELECTRONICS CO., LTD., Suwon-si (KR)

(72) Inventors: Donggun Oh, Suwon-si (KR); Jinho Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 525 days.

(21) Appl. No.: 18/108,925

(22) Filed: Feb. 13, 2023

(65) Prior Publication Data

US 2023/0207764 A1      Jun. 29, 2023

Related U.S. Application Data

(63) Continuation of application No. PCT/KR2021/010505, filed on Aug. 9, 2021.

(30) Foreign Application Priority Data

Aug. 14, 2020     (KR) ......................... 10-2020-0102664

(51) Int. Cl.
  *H10H 20/857*       (2025.01)
  *G09G 3/32*         (2016.01)
  (Continued)

(52) U.S. Cl.
  CPC ............. *H10H 20/857* (2025.01); *G09G 3/32* (2013.01); *H10H 20/01* (2025.01);
  (Continued)

(58) Field of Classification Search
  CPC .. G09G 2300/0426; G09G 3/32; H01L 21/28; H01L 25/0753; H01L 25/167;
  (Continued)

(56) References Cited

U.S. PATENT DOCUMENTS 7,626,331 B2    12/2009  Lee et al.
7,951,627 B2     5/2011  Ishida et al.
            (Continued)

FOREIGN PATENT DOCUMENTS

JP        2004-327215 A      11/2004
JP        2007-265973 A      10/2007
            (Continued)

OTHER PUBLICATIONS

International Search Report (PCT/ISA/210) dated Dec. 16, 2021, issued by the International Searching Authority in International Application No. PCT/KR2021/010505.

(Continued)

*Primary Examiner* — Mark W Tornow
*Assistant Examiner* — Priya M Rampersaud
(74) *Attorney, Agent, or Firm* — Sughrue Mion, PLLC

(57)          ABSTRACT
A display device includes a display panel including: a transparent substrate; an inorganic light emitting element provided on the transparent substrate and configured to emit a light toward the transparent substrate; a first insulating layer provided on the inorganic light emitting element; and a thin film transistor provided on the first insulating layer; and a driver integrated circuit (IC) configured to drive the display panel, wherein at least a portion of the thin film transistor overlaps at least a portion of the inorganic light emitting element.

13 Claims, 18 Drawing Sheets

(51) Int. Cl.
　　*H10H 20/01*　　　　(2025.01)
　　*H10H 20/815*　　　(2025.01)
　　*H10H 20/851*　　　(2025.01)
　　*H10H 29/14*　　　 (2025.01)

(52) U.S. Cl.
　　CPC ........ *H10H 20/815* (2025.01); *H10H 20/851*
　　　　(2025.01); *H10H 29/142* (2025.01); *H10H*
　　　　　　　　　　　　　　*20/0364* (2025.01)

(58) Field of Classification Search
　　CPC ...... H10D 86/441; H10D 86/60; H10D 30/67;
　　　　　　　H10D 64/011; H10D 86/451; H10H
　　　　　　　20/01; H10H 20/0362; H10H 20/0364;
　　　　　　　H10H 20/815; H10H 20/851; H10H
　　　　　　　20/8513; H10H 20/852; H10H 20/857;
　　　　　　　　　　　H10H 29/142; H10W 90/00
　　See application file for complete search history.

(56) References Cited

U.S. PATENT DOCUMENTS

| | | | | |
|---|---|---|---|---|
| 9,224,755 | B2 * | 12/2015 | Bedell | H10D 86/60 |
| 9,871,060 | B2 | 1/2018 | Saito et al. | |
| 10,008,610 | B2 | 6/2018 | Park | |
| 10,109,698 | B2 | 10/2018 | Kang et al. | |
| 10,263,060 | B2 | 4/2019 | Noh et al. | |
| 10,269,779 | B2 | 4/2019 | Lu | |
| 10,304,919 | B2 | 5/2019 | Jinbo et al. | |
| 10,345,643 | B2 | 7/2019 | Li | |
| 10,903,195 | B2 | 1/2021 | Choi et al. | |
| 10,930,789 | B2 | 2/2021 | Park | |
| 11,075,329 | B2 | 7/2021 | Jung et al. | |
| 11,387,220 | B2 | 7/2022 | Jang et al. | |
| 11,961,871 | B2 * | 4/2024 | Kusunoki | H10H 29/142 |
| 2006/0238115 | A1 * | 10/2006 | Lee | H10K 10/466 |
| | | | | 313/504 |
| 2007/0205423 | A1 | 9/2007 | Yamazaki et al. | |
| 2008/0116787 | A1 * | 5/2008 | Hsu | H10K 59/121 |
| | | | | 257/E27.113 |
| 2014/0008668 | A1 * | 1/2014 | Hirakata | H10K 71/80 |
| | | | | 438/23 |
| 2018/0188606 | A1 * | 7/2018 | Lee | G02F 1/133512 |
| 2019/0165035 | A1 * | 5/2019 | Fu | H10H 29/10 |
| 2019/0244567 | A1 * | 8/2019 | Cho | G09G 3/3233 |
| 2019/0371232 | A1 * | 12/2019 | Kim | G09G 3/2014 |
| 2020/0161282 | A1 | 5/2020 | Kang et al. | |
| 2020/0203235 | A1 * | 6/2020 | Jung | H10D 86/60 |
| 2021/0143209 | A1 * | 5/2021 | Yamazaki | G09G 3/32 |
| 2021/0167047 | A1 * | 6/2021 | Lee | H10H 20/857 |
| 2022/0301500 | A1 | 9/2022 | Shigeta et al. | |

FOREIGN PATENT DOCUMENTS

| | | | |
|---|---|---|---|
| JP | 2006-243127 | A | 9/2009 |
| JP | 2016-154213 | A | 8/2016 |
| KR | 10-2017-0002730 | A | 1/2017 |
| KR | 10-2017-0026954 | A | 3/2017 |
| KR | 10-2018-0130521 | A | 12/2018 |
| KR | 10-2019-0035319 | A | 4/2019 |
| KR | 10-2020-0031279 | A | 3/2020 |
| KR | 10-2020-0056628 | A | 5/2020 |
| KR | 10-2020-0074591 | A | 6/2020 |
| KR | 10-2021-0108742 | A | 9/2021 |

OTHER PUBLICATIONS

Written Opinion (PCT/ISA/237) dated Dec. 16, 2021 issued by the International Searching Authority in International Application No. PCT/KR2021/010505.
Communication issued on Nov. 7, 2024 by the Korean Intellectual Property Office in Korean Patent Application No. 10-2020-0102664.

* cited by examiner

DISPLAY DEVICE AND METHOD FOR MANUFACTURING SAME

CROSS-REFERENCE TO RELATED APPLICATION(S)

This application is a bypass continuation of International Application No. PCT/KR2021/010505, filed on Aug. 9, 2021, in the Korean Intellectual Property Receiving Office, which is based on and claims priority to Korean Patent Application No. 10-2020-0102664, filed on Aug. 14, 2020, in the Korean Intellectual Property Office, the disclosures of which are incorporated herein by reference in their entireties.

BACKGROUND

1. Field

The present disclosure relates to a display device capable of implementing an image using an inorganic light emitting element and a method for manufacturing the same.

2. Description of Related Art

A display device may be classified as a self-luminous display in which each pixel emits light by itself and a non-self-luminous display that requires a separate light source.

A liquid crystal display (LCD) is a representative non-self-luminous display. Because the LCD requires a backlight unit that supplies light from the rear of the display panel, a liquid crystal layer that acts as a switch to pass/block light, and a color filter that changes the supplied light to a desired color, the LCD is structurally complex and has limitations in implementing thin.

However, the self-luminous display in which each pixel includes a light emitting element and each pixel emits light by itself does not require a backlight unit, a liquid crystal layer, and a color filter. Therefore, the self-luminous display may give a high degree of design freedom because of its simple components and may be manufactured with a thin thickness. In addition, the self-luminous display has excellent contrast ratio, brightness, and viewing angle.

A micro-light emitting diode (LED) display panel is self-luminous and is composed of a plurality of LEDs, each of which is about 100 micrometers. The micro-LED display panel may provide superior response time and energy efficiency in comparison with the LCD panel.

In addition, the micro-LED, which is an inorganic light emitting element, is brighter, has a better luminous efficiency, and has a longer lifespan than an organic light emitting diode (OLED) that require a separate encapsulation layer to protect organic materials.

SUMMARY

Provided are a display device of bottom emission type capable of reducing a pixel size and realizing a high resolution in the same screen size by maximizing an emission area, and a manufacturing method thereof.

Additional aspects will be set forth in part in the description which follows and, in part, will be apparent from the description, or may be learned by practice of the presented embodiments.

According to an aspect of the disclosure, a display device includes: a display panel including: a transparent substrate;

an inorganic light emitting element provided on the transparent substrate and configured to emit a light toward the transparent substrate; a first insulating layer provided on the inorganic light emitting element; and a thin film transistor provided on the first insulating layer; and a driver integrated circuit (IC) configured to drive the display panel, wherein at least a portion of the thin film transistor overlaps at least a portion of the inorganic light emitting element.

The display device may further include a first buffer layer between the transparent substrate and the inorganic light emitting element, the first buffer layer including an adhesive material.

The inorganic light emitting element may include: a light emitting surface facing the transparent substrate; and a pair of electrodes facing the first insulating layer in a direction opposite to a light emitting direction of the light emitting surface.

The driver IC may be provided on the display panel in the direction opposite to the light emitting surface.

The portion of the thin film transistor may overlap the portion of the inorganic light emitting element on a plane on which the transparent substrate is provided.

The display panel further may include a plurality of pixels arranged in two dimensions, and each of the plurality of pixels may include at least three sub-pixels, and each of the at least three sub-pixels is configured to emit light of a color different from colors of light emitted from others of the at least three sub-pixels.

The at least three sub-pixels include a red sub-pixel, a green sub-pixel, and a blue sub-pixel, the red sub-pixel among the at least three sub-pixels may include a red inorganic light emitting element configured to emit red light; the green sub-pixel among the at least three sub-pixels may include a green inorganic light emitting element configured to emit green light; and the blue sub-pixel among the at least three sub-pixels may include a blue inorganic light emitting element configured to emit blue light.

Each of the at least three sub-pixels may include an inorganic light emitting element emitting light of a same color, and the display device further may include a color conversion layer between the transparent substrate and the inorganic light emitting element.

The thin film transistor may include: a gate electrode; a source electrode; and a drain electrode, and the display device may further include a second insulating layer between the gate electrode, the source electrode, and the drain electrode.

The thin film transistor may include a low temperature polycrystalline silicon (LTPS) thin film transistor, and the second insulating layer may include an inter-layer dielectric (ILD).

The display panel further may include: a third insulating layer provided on the second insulating layer; and an electrode pad provided on the third insulating layer and connected to the driver IC.

The electrode pad may be connected with the inorganic light emitting element by a contact hole penetrating through the third insulating layer, the second insulating layer, and the first insulating layer.

According to an aspect of the disclosure, a manufacturing method for a display device, includes: transferring an inorganic light emitting element onto a transparent substrate; forming a first insulating layer on the inorganic light emitting element; and forming a thin film transistor on the first insulating layer so that at least a portion of the thin film transistor overlaps at least a portion of the inorganic light emitting element, the thin film transistor being connected with the inorganic light emitting element by a contact hole penetrating through the first insulating layer.

The transferring the inorganic light emitting element onto the transparent substrate may include forming a first buffer layer including an adhesive material on the transparent substrate so that the inorganic light emitting element is transferred onto the transparent substrate on which the first buffer layer is formed.

The transferring the inorganic light emitting element onto the transparent substrate may include transferring the inorganic light emitting element so that a light emitting surface of the inorganic light emitting element faces the transparent substrate and a pair of electrodes of the inorganic light emitting element faces the first insulating layer.

BRIEF DESCRIPTION OF DRAWINGS

The above and other aspects, features, and advantages of certain embodiments of the present disclosure will be more apparent from the following description taken in conjunction with the accompanying drawings, in which.

4

Figure 14:
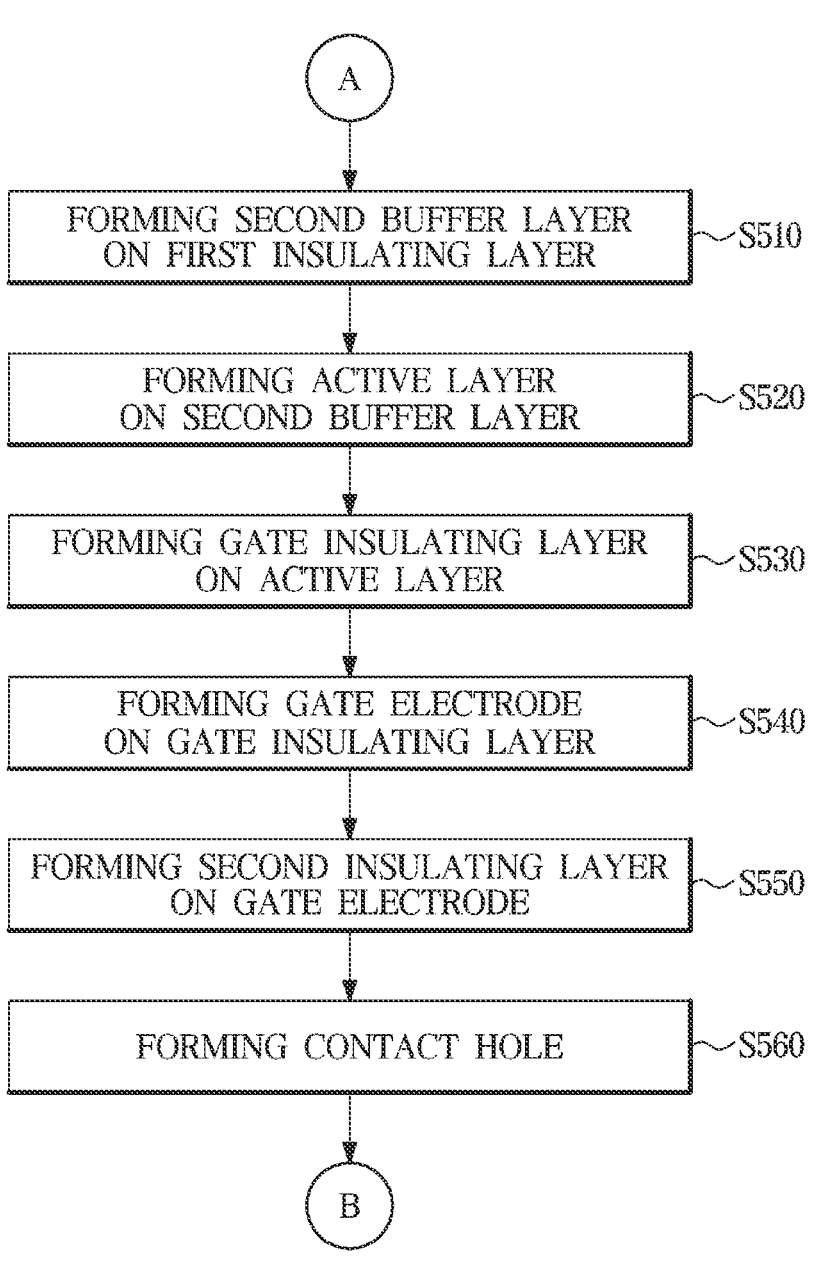
FIG. 14 is a flowchart illustrating another partial process of the method of manufacturing the display device according to an embodiment of the present disclosure.
Figure 15:
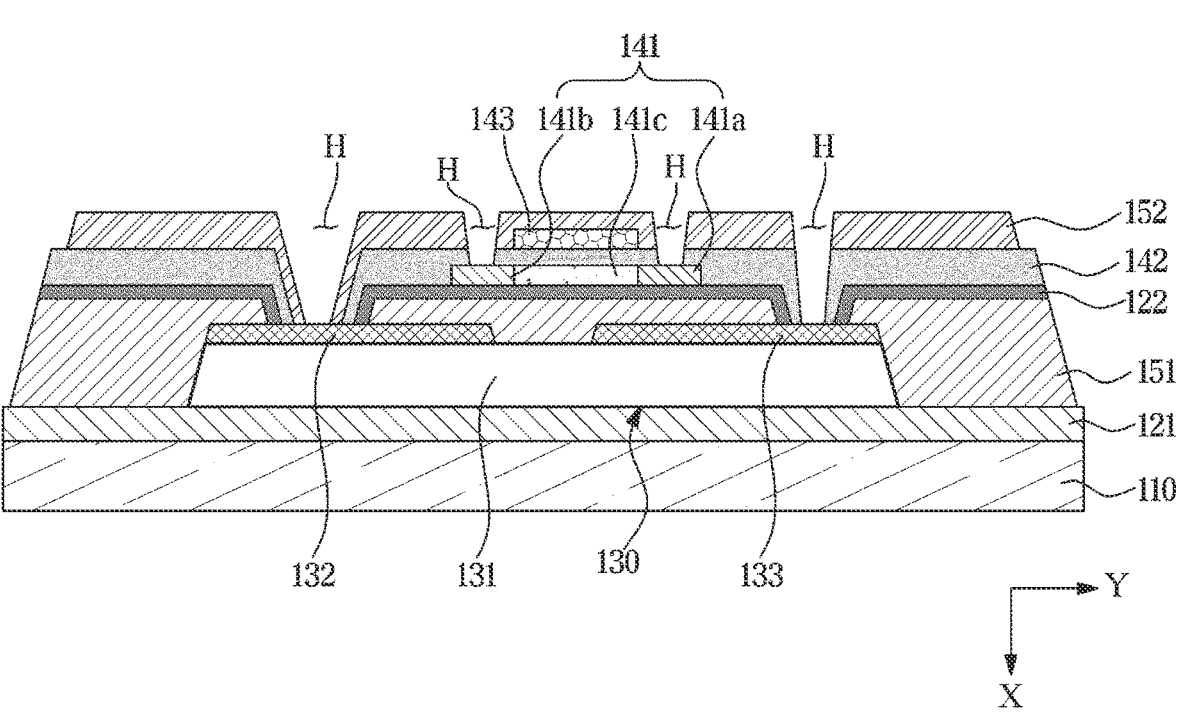
Figure 16:
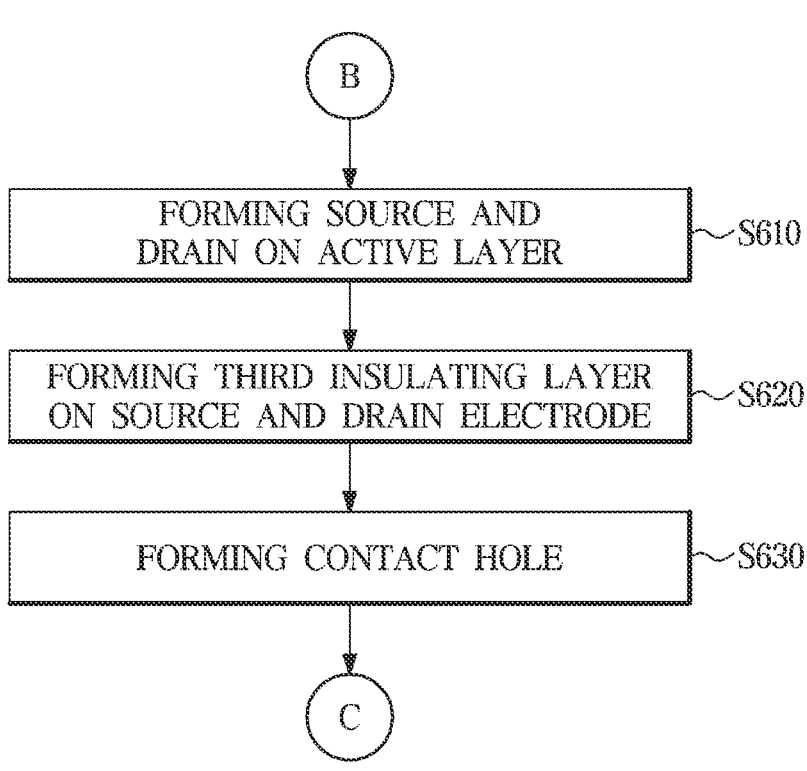
Figure 17:
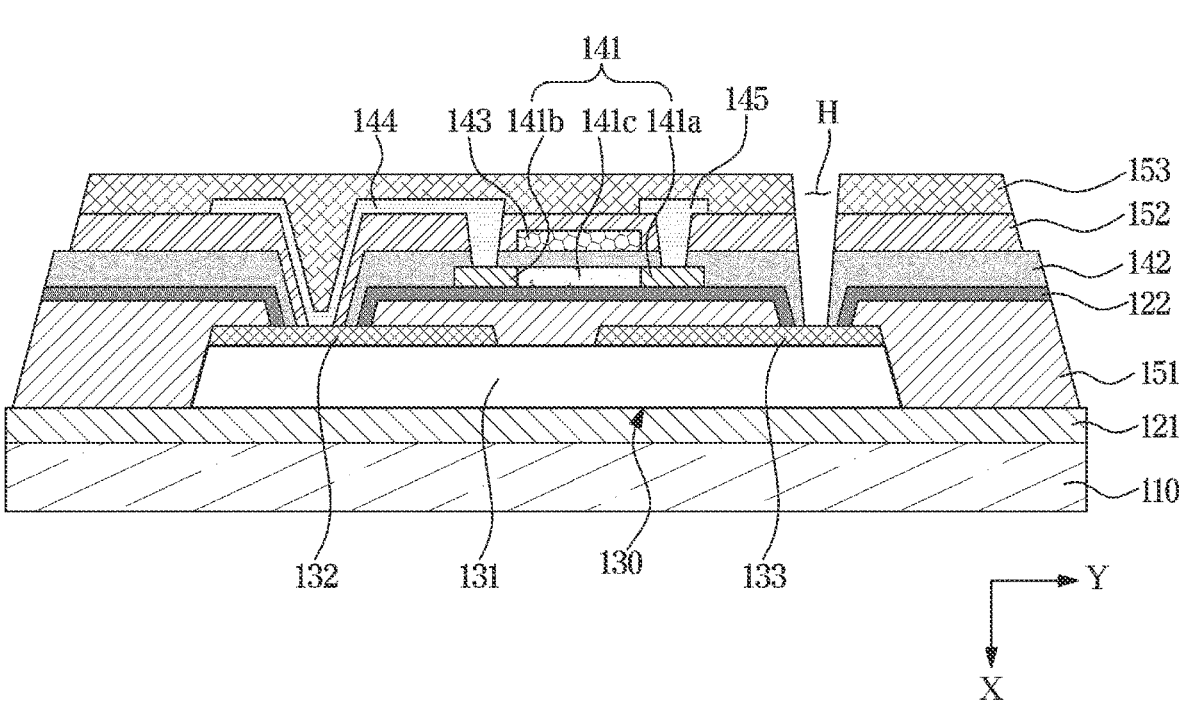
Figure 18:
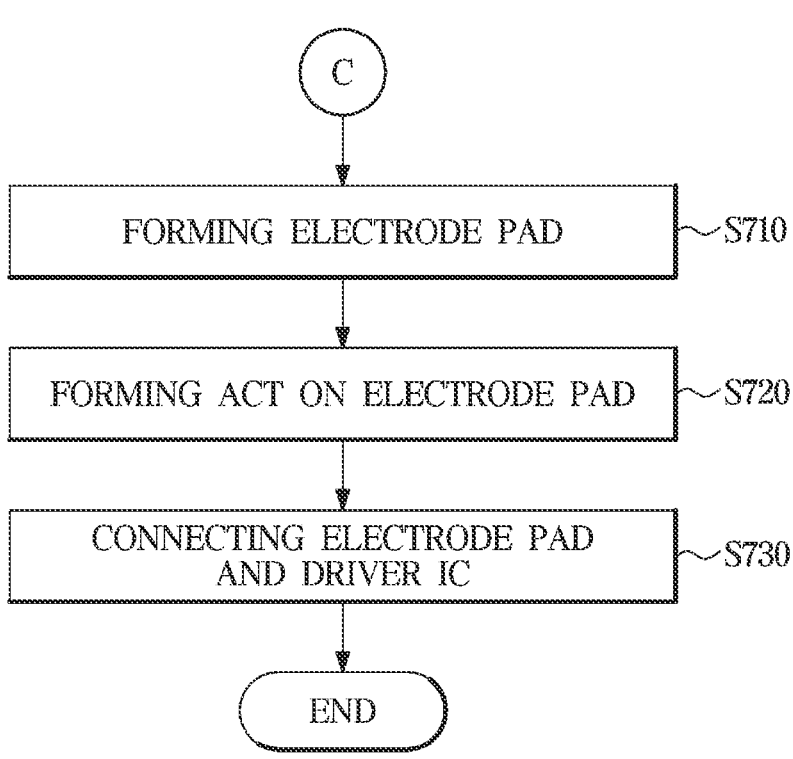

FIG. 15 is a cross-sectional view illustrating the display device manufactured by the process according to the flowchart of FIG. 14 according to an embodiment of the present disclosure;

FIG. 16 is a flowchart illustrating another partial process of the method of manufacturing the display device according to an embodiment of the present disclosure;

FIG. 17 is a cross-sectional view illustrating the display device manufactured by the process according to the flowchart of FIG. 16 according to an embodiment of the present disclosure; and FIG. 18 is a flowchart illustrating another partial process of the method of manufacturing the display device according to an embodiment of the present disclosure.

DETAILED DESCRIPTION

Throughout the specification, the same reference numerals refer to the same components. This specification does not describe all elements of the embodiments, and general content in the technical field to which the disclosure belongs or content that overlaps between the embodiments is omitted. As used herein, the term 'part, module, member, block' may be implemented in software or hardware. According to embodiments, a plurality of 'units, modules, members, and blocks' may be implemented as one component, or one 'unit, module, member, or block' may include a plurality of components.

Throughout the specification, when it is disclosed that a part is "connected" with another part, this includes not only a case in which it is directly connected, but also a case in which it is indirectly connected with another component. The indirect connection includes being connected using a wireless communication network or electrically connected using an electrical wiring.

Also, when it is disclosed that a part "includes" a certain component, unless otherwise stated, it means that other components may be further included, rather than excluding other components.

Throughout the specification, when it is disclosed that a member is said to be located "on" another member, this includes not only a case in which a member is in contact with another member but also a case in which another member is present between the two members.

Throughout the specification, when it is disclosed that a component transmits a signal or data to another component, unless otherwise stated, another component exists between the component and the other component, so that it does not exclude transmission through this component Throughout the specification, expressions of ordinal numbers such as "first" and "second" are used to distinguish a plurality of components from each other, and the used ordinal number does not indicate the arrangement order, manufacturing order, or importance between the components.

The singular expression includes the plural expression unless the context clearly dictates otherwise.

In each step, an identification code is used to refer to each step. This identification code does not limit the order of each step, and each step may be performed differently from the stated order unless the context clearly indicates a specific order.

Hereinafter an embodiment of a display device and a manufacturing method thereof according to an aspect of the disclosure will be described in detail with reference to the accompanying drawings.

Figure 1:
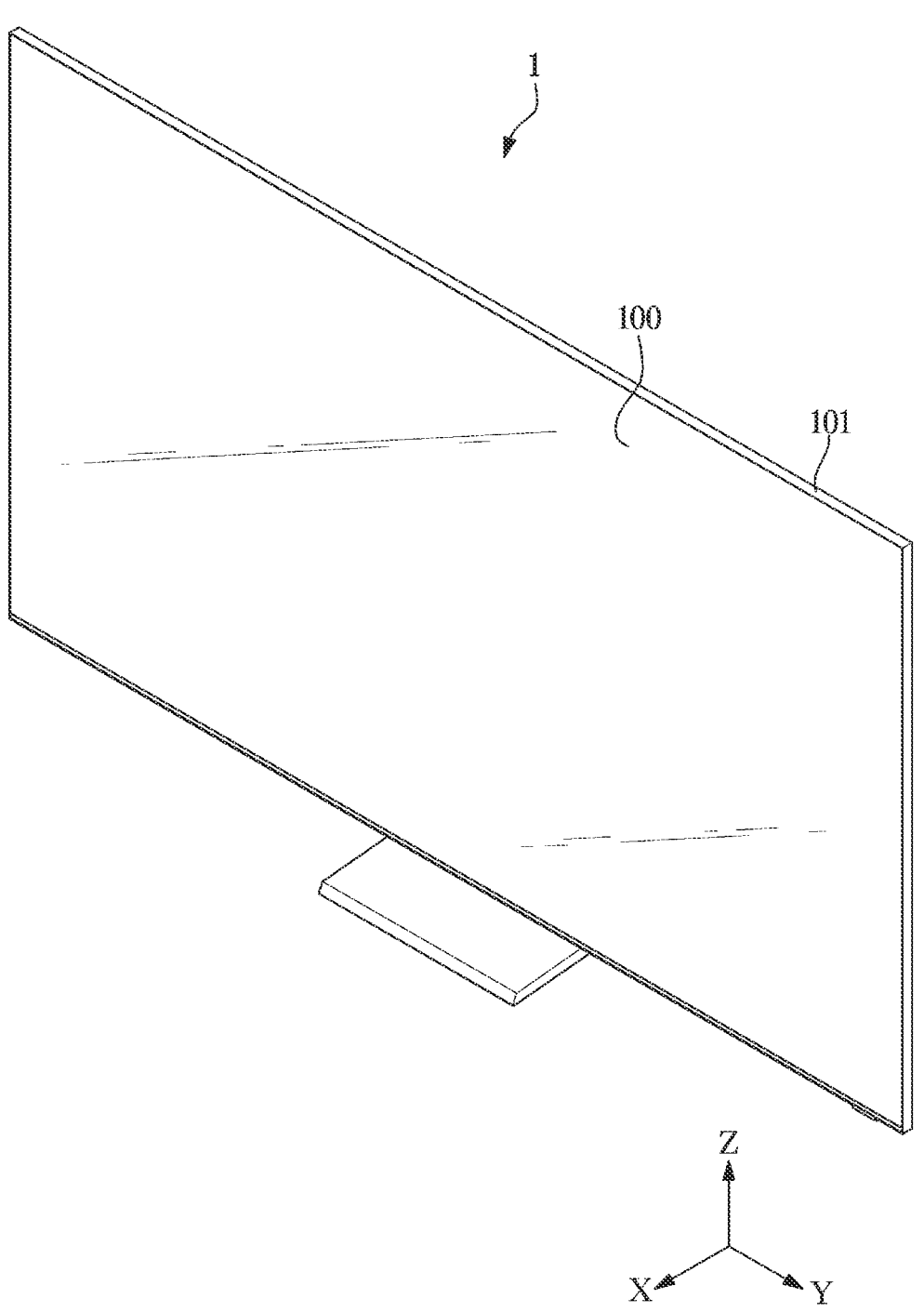
FIG. 1 is a diagram illustrating an example of an appearance of a display device according to an embodiment of the present disclosure.
Figure 2:
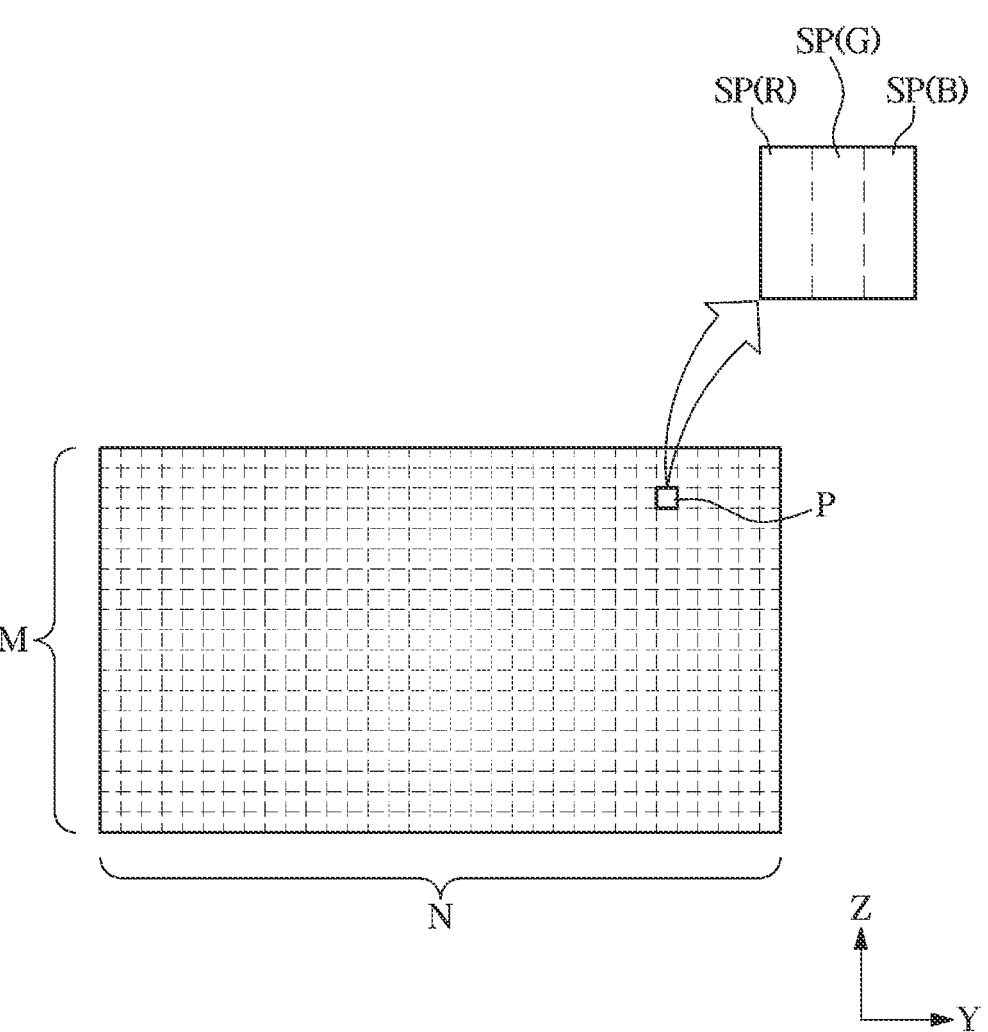
FIG. 2 is a diagram illustrating an example of a pixel arrangement of the display device according to an embodiment of the present disclosure.

FIG. 1 is a diagram illustrating an example of an appearance of a display device according to an embodiment of the present disclosure. FIG. 2 is a diagram illustrating an example of a pixel arrangement of the display device according to an embodiment of the present disclosure.

Referring to FIG. 1, a display device 1 according to an embodiment of the present disclosure may include a display panel 100 in which a light emitting element is disposed for each pixel to allow each pixel to emit light by itself. The display panel 100 may be fixed to a main body 101 in which circuit elements such as a driver integrated circuit (IC) and various components are accommodated.

Unlike a liquid crystal display device, the display device 1 according to an embodiment of the present disclosure does not require components such as a backlight unit and a liquid crystal layer. Accordingly, the display device 1 may have a thin thickness and a simple structure, and thus various design changes may be possible.

In addition, the display device 1 according to an embodiment may employ an inorganic light emitting element such as an inorganic light emitting diode as a light emitting element disposed in each pixel. The inorganic light emitting element has a faster response speed than organic light emitting element such as organic light emitting diode (OLED) and may realize high brightness with low power.

In addition, because the organic light emitting device is vulnerable to exposure to moisture and oxygen, an encapsulation process is required and thus the durability is weak, but the display device 1 according to the disclosure does not require the encapsulation process and is advantageous in durability. Hereinafter a light emitting element referred to in an embodiment means an inorganic light emitting diode.

The inorganic light emitting element employed in the display device 1 according to an embodiment of the present disclosure may be a micro-LED having a short side length of about 100 μm. As such, by employing the micro-LED, it may be possible to reduce the pixel size and realize a high resolution.

In addition, in case that the inorganic light emitting element is manufactured in the size of a micro unit, the difficulty of destruction of the inorganic light emitting element may be relieved because the inorganic material is strong against bending. That is, in case that the micro-LED is transferred to a flexible substrate, the micro-LED is not broken even when the substrate is bent, and thus a flexible display device may be implemented.

FIG. 1 is a diagram showing the display device 1 applied to a television (TV), but the display device 1 is not limited thereto, and may be applied to various products such as a wearable device, a portable device, a personal computer (PC) monitor, a signage, an electric sign board, and the like.

A three-dimensional coordinate system of the XYZ axis shown in FIG. 1 is based on the display device 1. A plane on which the display panel 100 is positioned is a YZ plane, and a direction in which the display panel 100 outputs an image or a direction in which the inorganic light emitting element emits light is the +X direction. Because the coordinate system is based on the display device 1, the same coordinate system may be applied when the display device 1 is lying or standing.

In general, because a user views an image from the front side of the display device 1 with the display device 1 in an upright state, the +X direction in which the image is output may be called the front side, and the opposite direction may be called the rear side.

Also, in general, the display device 1 is manufactured in a lying state. Therefore, it may be also possible that the +X direction of the display device 1 is referred to as a lower direction, and the −X direction is referred to as an upper direction.

All four corners of the flat panel display device 1 or the display panel 100 will be referred to as side surfaces regardless of the posture of the display device 1.

Referring to FIG. 2, the display panel 100 may have a two-dimensional pixel structure of an M×N (M, N is an integer greater than 2) array, and a unit pixel P may include at least three sub-pixels that outputs the light of different colors. For example, the unit pixel P may include three sub-pixels SP(R), SP(G), and SP(B) corresponding to R, G, and B, respectively. For example, the red sub-pixel SP(R) may output red light, the green sub-pixel SP(G) may output green light, and the blue sub-pixel SP(B) may emit blue light.

However, the pixel arrangement of FIG. 2 is merely an example applicable to the display device 1. The sub-pixels may be arranged along the Z-axis direction or not arranged in a line. In addition, it may be also possible that the sizes of the sub-pixels are different from each other. The unit pixel P only needs to include a plurality of sub-pixels to implement a plurality of colors, and there is no limitation in the size or arrangement of each sub-pixel.

Also, the unit pixel P may not necessarily include the red sub-pixel SP(R), the green sub-pixel SP(G), and the blue sub-pixel SP(B). The unit pixel P may be composed of sub-pixels emitting yellow light or white light. That is, there is no limitation in the color or type of light output from each sub-pixel and the number of sub-pixels.

However, for a detailed description, in an embodiment to be described later, it is limited that the unit pixel P includes only the red sub-pixel SP(R), the green sub-pixel SP(G), and the blue sub-pixel SP(B).

Figure 3:
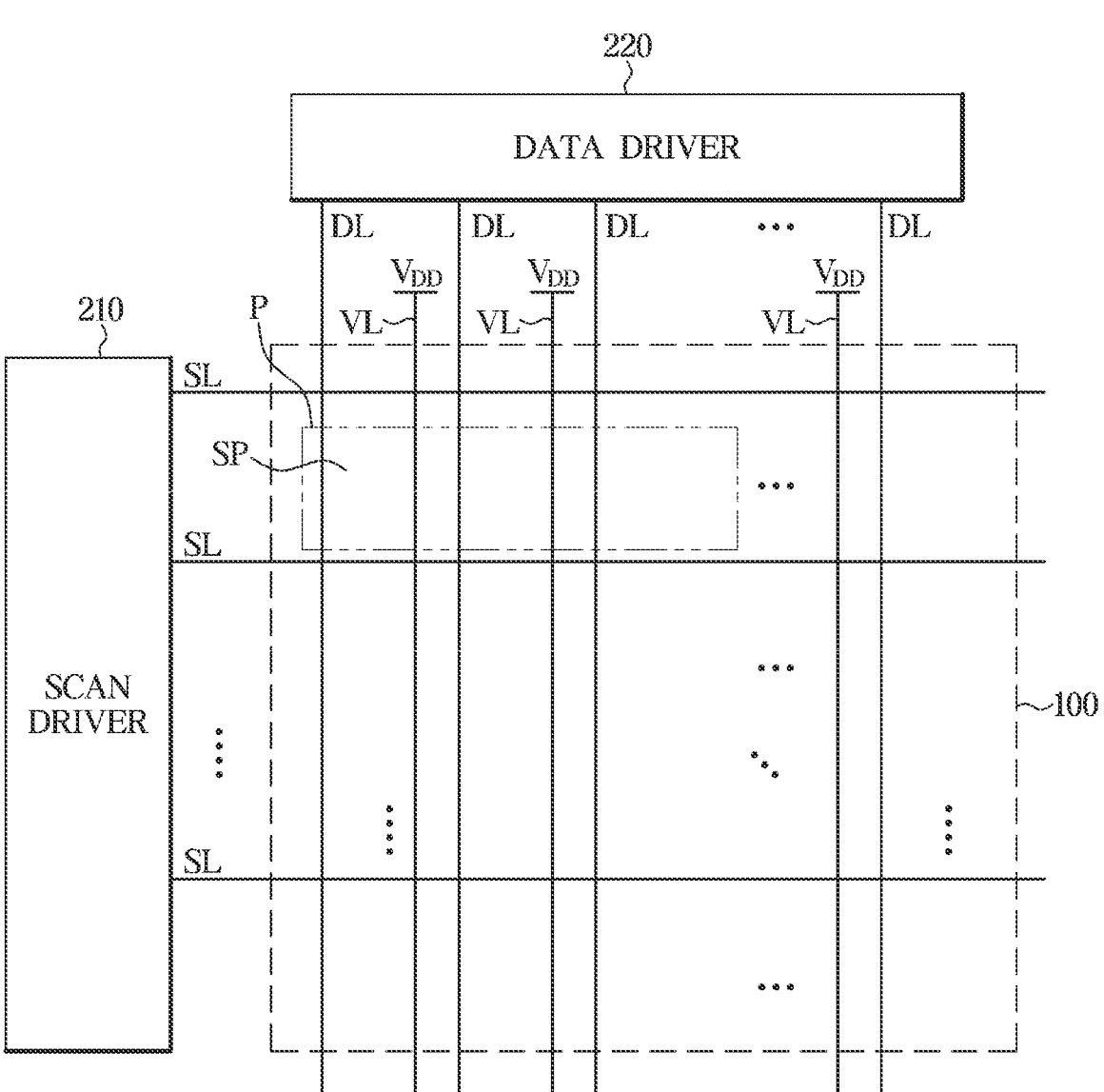
FIG. 3 is a diagram illustrating a method in which each pixel is driven in the display device according to an embodiment of the present disclosure.
Figure 4:
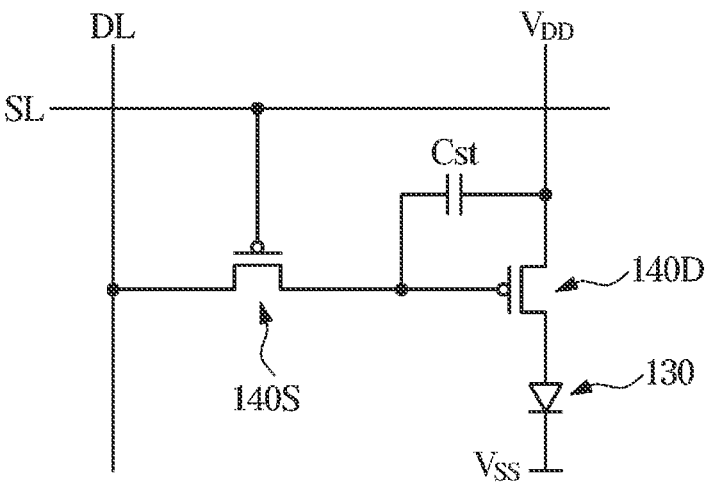
FIG. 4 is a diagram schematically illustrating a thin film transistor (TFT) circuit for driving a sub-pixel in the display device according to an embodiment of the present disclosure.

FIG. 3 is a diagram illustrating a method in which each pixel is driven in the display device according to an embodiment of the present disclosure. FIG. 4 is a diagram schematically illustrating a thin film transistor (TFT) circuit for driving a sub-pixel in the display device according to an embodiment of the present disclosure.

Referring to FIG. 3, a plurality of data lines DL and power lines VL formed in a column direction and scan lines SL formed in a row direction may be provided in the form of electrode patterns.

Regions partitioned by the data line DL and the scan line SL may correspond to the sub-pixel SP, and a plurality of adjacent sub-pixels SP may constitute one unit pixel P.

The data line DL may transmit a data signal implementing an image to the sub-pixel SP, and the scan line SL may transmit a scan signal for turning the sub-pixel on/off to the sub-pixel SP. The power supply line VL may supply a power supply voltage VDD to the sub-pixels for a time corresponding to one frame.

When a scan driver 210 applies a scan signal to the scan line SL, the sub-pixel SP connected to the scan line SL to which the scan signal is applied is turned on. When a data driver 220 applies a data voltage $V_{DATA}$ corresponding to an image signal to the data line DL, the data voltage $V_{DATA}$ is applied to the turned-on subpixel SP among the subpixels connected to the data line DL.

Referring to FIG. 4, an inorganic light emitting element 130 configured to supply light to each sub-pixel may be provided, and a TFT driving circuit for driving the inorganic light emitting element 130 may include a thin film transistor 140 and a capacitor Cst. As described above, the inorganic light emitting element 130 may be a micro-LED.

For example, the thin film transistor 140 may include a switching transistor 140S and a driving transistor 140D, and the switching transistor 140S and the driving transistor 140D may be implemented as a p-type metal-oxide-semiconductor (PMOS) type transistor. However, the embodiment of the disclosure is not limited thereto. Alternatively, the switching transistor 140S and the driving transistor 140D may be implemented as an n-type MOS (NMOS) type transistors.

A gate electrode of the switching transistor 140S is connected to the scan line SL, and a source electrode is connected to the data line DL. A drain electrode of the switching transistor 140S is connected to one end of the capacitor Cst and a gate electrode of the driving transistor 140D, and the other end of the capacitor Cst is connected to the power supply line VL.

In addition, a source electrode of the driving transistor 140D is connected to the power supply line VL, and a drain electrode is connected to an anode 132 (refer to FIG. 6) of the inorganic light emitting element 130. A reference voltage $V_{SS}$ is supplied to a cathode 133 (refer to FIG. 6) of the inorganic light emitting element 130. The reference voltage $V_{SS}$ may be a voltage of a lower level than the power voltage VDD, and a ground voltage or the like may be used to provide a ground.

The sub-pixel of the above-described structure may operate as follows. First, when a scan signal is applied to the scan line SL and the switching transistor 140S is turned on, the data voltage $V_{DATA}$ applied to the data line DL may be transmitted to one end of the capacitor Cst and the gate electrode of the driving transistor 140D.

A voltage corresponding to the gate-source voltage VGS of the driving transistor 140D may be maintained for a predetermined time by the capacitor Cst. The driving transistor 140D may allow the inorganic light emitting element 130 to emit light by applying a driving current IGS corresponding to the gate-source voltage VGS to the anode 132 of the inorganic light emitting element 130.

At this time, when a high data voltage $V_{DATA}$ is applied to the gate electrode of the driving transistor 140D, the gate-source voltage VGS of the driving transistor 140D is lowered, and thus a small amount of driving current IGS may be applied to the anode 132 of the inorganic light emitting element 130 and the inorganic light emitting element 130 may display a low grayscale.

On the other hand, when a low data voltage $V_{DATA}$ is applied to the gate electrode, the gate-source voltage VGS of the driving transistor 140D increases, and thus a large amount of driving current IGS may be applied to the anode 132 of the inorganic light emitting element 130 and the inorganic light emitting element 130 may display a high grayscale.

In the above example, an active matrix (AM) structure including the capacitor Cst has been described, but the embodiment of the display panel 100 is not limited thereto, and a passive matrix (PM) structure may be employed.

Figure 5:
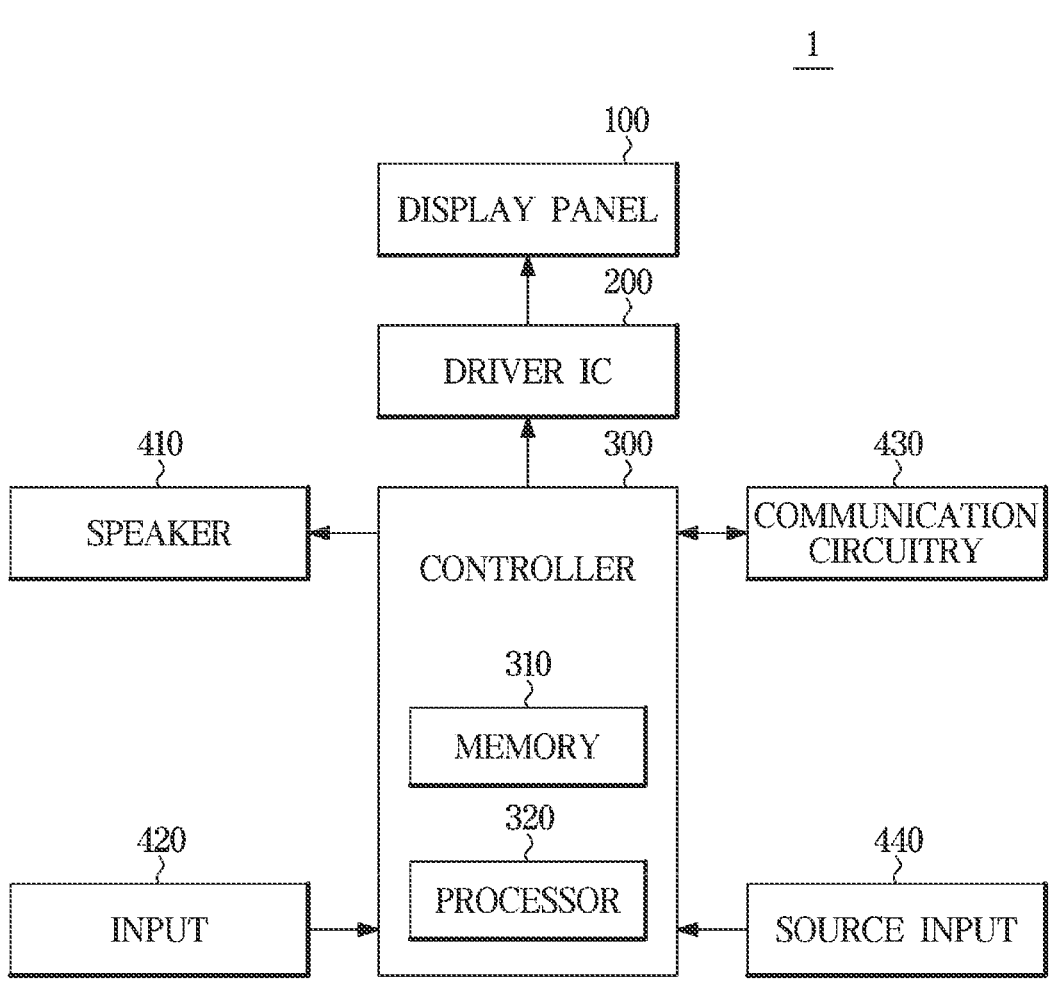
FIG. 5 is a diagram of the display device according to an embodiment of the present disclosure.

FIG. 5 is a diagram of the display device according to an embodiment of the present disclosure.

Referring to FIG. 5, the display device 1 according to an embodiment of the present disclosure may include the display panel 100 displaying an image, a driver integrated circuit (IC) 200 driving each of a plurality of pixels of the display panel 100, and a speaker outputting sound. In addition, the display device 1 may further include an input 420 receiving a control command from a user, a source input 440 through which an image to be displayed on the display panel 100 is input, a communication circuitry 430 communicating with other external devices, and a controller 300 configured to control the overall operation of the display device 1.

The display panel 100 may be composed of a plurality of pixels arranged in two dimensions as described above, and each pixel may be composed of a plurality of sub-pixels to display a plurality of colors. The inorganic light emitting element 130 may be disposed in each sub-pixel to emit red, green, and blue light, and an independent TFT circuit may be provided for each sub-pixel to individually control the sub-pixels. A specific structure of the display panel 100 will be described in detail later.

The driver IC 200 may include a driving circuit configured to drive a plurality of pixels. For example, the driver IC 200 may include the scan driver 210 and the data driver 220 described above.

The driver IC 200 may be electrically connected to the display panel 100 by adopting one of various bonding methods such as chip on film (COF) bonding, film on glass (FOG) bonding, chip on glass (COG) bonding, and tape automated bonding (TAB).

The driver IC 200 may be disposed in a direction opposite to the light emission direction of the micro-LED or disposed on the side surface of the display panel 100.

For example, in case that the display device is a top emission type, the driver IC may be disposed on the side and rear surfaces of the display panel to be electrically connected to the thin film transistor. In case of being disposed on the rear surface, the thin film transistor may be disposed between a substrate supporting the inorganic light emitting element and the inorganic light emitting element with electrically connected.

In case that the display device may be a bottom emission type, the driver IC may be disposed on the rear surface of the display panel, that is, may be disposed in a direction opposite to an emission direction and directly electrically connected to the thin film transistor.

The display device 1 according to an embodiment of the present disclosure may employ a bottom emission type in which the inorganic light emitting element 130 emits light toward the substrate. Accordingly, the driver IC 200 may be disposed on the rear surface of the display panel 100, and thus a bezel of the display device 1 may be minimized or omitted.

The display device 1 according to an embodiment of the present disclosure may employ a bottom emission type and may include a structure capable of preventing a decrease in an aperture ratio due to the presence of a non-emission region in which circuit elements are disposed within a single pixel region. In addition, the display device 1 may include a structure capable of preventing stains generated when the display panel is driven while realizing a high resolution. This structure will be described in detail later.

The input 420 may include a button or a touch pad provided on a region of the display device 1, and in case that the display panel 100 is a touch screen type, the input 420 may include a touch pad arranged on a front surface of the display panel 100. Also, the input 420 may include a remote controller.

The input 420 may receive various commands for controlling the display device 1, such as power on/off, volume adjustment, channel adjustment, screen adjustment, and various setting changes of the display device 1 from the user.

The communication circuitry 430 may communicate with a relay server or other electronic device to exchange necessary data. The communication circuitry 430 may employ at least one of various wireless communication methods.

Representative wireless communication methods are $3^{rd}$ Generation (3G), $4^{th}$ Generation (4G), wireless local access network (WLAN), Wi-Fi, Bluetooth, Zigbee, Wi-Fi direct (WFD), ultra wideband (UWB), infrared data association (IrDA), Bluetooth low energy (BLE), near field communication (NFC), Z-Wave, and the like. In addition, the communication circuitry 430 may employ a wired communication method such as peripheral component interconnect (PCI), PCI-express, or universal serial bus (USB).

The source input 440 may receive source signals from a set-top box, USB, antenna, or the like. Accordingly, the source input 440 may include at least one source input terminal such as a high definition multimedia interface (HDMI) port, a USB port, an antenna jack, and the like.

The source signal received by the source input 440 may be processed by the controller 300 and output as images and sounds on the display panel 100 and through the speaker 410.

The controller 300 may include at least one memory 310 for storing a program and various data for controlling the display device 1, and at least one processor 320 for executing the stored program.

The speaker 410 may be provided in a main body 101 or a separate speaker module physically separated from the main body 101 may be further provided.

Figure 6:
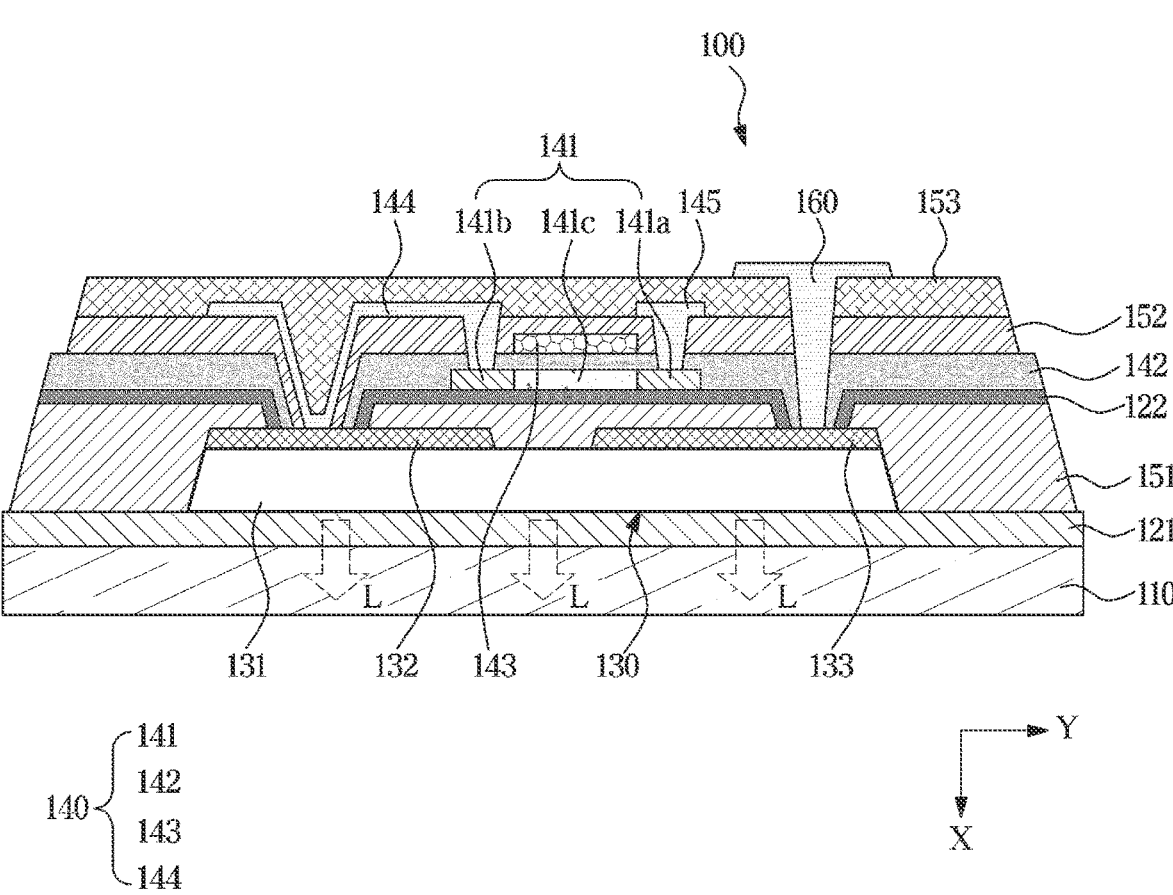
FIG. 6 is a cross-sectional view illustrating a structure of a display panel of the display device according to an embodiment of the present disclosure.

FIG. 6 is a cross-sectional view illustrating a structure of a display panel of the display device according to an embodiment of the present disclosure. The structure shown in FIG. 6 is a structure corresponding to a single sub-pixel.

Referring to FIG. 6, the display panel 100 of the display device 1 according to an embodiment of the present disclosure may include a transparent substrate 110, and the inorganic light emitting element 130 disposed on the transparent substrate 110 and emitting light toward the transparent substrate 110. In addition, the display panel 100 may include a first insulating layer 151 formed on the inorganic light emitting element 130 and the thin film transistor 140 formed on the first insulating layer 151. In this case, at least a portion of the thin film transistor 140 may be stacked to overlap with at least a portion of the inorganic light emitting element 130 disposed on a different layer.

That is, as for the display device 1 according to an embodiment of the present disclosure, the inorganic light emitting element 130 emitting light toward the transparent substrate 110 may be disposed on the transparent substrate 110, and various circuit elements including the thin film transistor 140 may be disposed on the inorganic light emitting element 130. Accordingly, the light emitting region of the inorganic light emitting element 130 is not affected by the circuit elements. Therefore, it is possible to efficiently use an area per unit pixel when manufacturing the inorganic light emitting element 130 and circuit elements for individually controlling the inorganic light emitting elements 130. In addition, it is possible to prevent the aperture ratio from decreasing due to a non-light emitting region occurring when circuit elements are arranged in the light emitting direction of the inorganic light emitting element 130, and prevent image stain that may occur due to diffuse reflection of light on circuit elements.

However, the structure shown in FIG. 6 is a cross-sectional view taken at an arbitrary point in a region corresponding to a single sub-pixel, and thus other circuit elements and another thin film transistor not shown in FIG. 6 may be present. The thin film transistor 140 shown in FIG. 6 corresponds to the driving transistor 140D electrically connected to the inorganic light emitting element 130. Therefore, it is possible that other transistor such as switching transistor may be formed to partially overlap with at least a part of the inorganic light emitting element 130 or may be formed non-overlapping.

That is, the driving transistor or the switching transistor may be formed on or around a vertical axis penetrating a central portion between the anode 132 and the cathode 133, corresponding to a pair of electrodes of the inorganic light emitting element.

In an embodiment, a concept of up and down may be relative and determined based on the light emission direction. Among the two components, a component located in the light emission direction (+x direction) of the inorganic light emitting element 130 may be defined as being located below. In addition, a component located in a direction opposite to light emission (−x direction) of the inorganic light emitting element 130 may be defined as being located up.

In an embodiment, the inorganic light emitting element 130 may be a flip-type light emitting element in which a pair of electrodes 132 and 133 are formed in a direction opposite to the light emission direction.

The transparent substrate 110 may be made of a transparent glass containing SiO2 as a main component or a transparent plastic having flexibility.

The plastic forming the transparent substrate 110 may be an organic material selected from a group consisting of insulating organic materials. The insulative organic group may include: polyether sulfone (PESo), polyacrylate (PAR), polyetherimide (PEI), polyethylene naphtholate (PEN), polyethylene terephthalate (PET), polyphenylene sulfide (PPS), polyallylate, polyimide, polycarbonate (PC), cellulose triacetate (TAC), and cellulose acetate propionate (CAP).

A transparent first buffer layer 121 may be formed between the transparent substrate 110 and the inorganic light emitting element 130. The first buffer layer 121 may provide a flat surface on the transparent substrate 110.

For example, the first buffer layer 121 may be made of an inorganic material such as silicon oxide, silicon nitride, silicon oxynitride, aluminum oxide, aluminum nitride, titanium oxide, titanium nitride, or organic material such as polyimide, polyester, acrylic, etc. The first buffer layer 121 may be formed of a plurality of laminates using the aforementioned materials.

The inorganic light emitting element 130 may be disposed on the first buffer layer 121. As described above, the inorganic light emitting element 130 may be a micro-LED. The micro-LED may be picked up from a wafer by a transfer apparatus and transferred to the transparent substrate 110. The transparent substrate 110 may be a substrate on which the first buffer layer 121 is formed for planarization.

The inorganic light emitting element 130 may include a p-n diode 131, an anode 132, and a cathode 133. The anode 132 and the cathode 133 may be formed of various conductive materials, such as metals, conductive oxides, conductive polymers, and the like.

The p-n diode 131 may include a p-doped portion of the anode 132, an n-doped portion of the cathode 133, and a quantum well portion between the p-doped portion and the n-doped portion. Conversely, the p-n diode 131 may include a p-doped portion of the cathode 133, an n-doped portion of the anode 132, and a quantum well.

As described above, the display device 1 according to an embodiment of the present disclosure may be a bottom emission type in which light L is emitted toward the transparent substrate 110. Accordingly, when a driving current is applied to the anode 132 of the inorganic light emitting element 130 and current flows from the anode 132 to the cathode 133, light is emitted toward the transparent substrate 110.

That is, the light emitting surface of the inorganic light emitting element 130 may face the transparent substrate 110. The p-n diode 131 of the inorganic light emitting element 130 may be disposed on a lower side close to the transparent substrate 110, and the anode 132 and the cathode 133 may be disposed on the p-n diode 131.

The first insulating layer 151 may be formed on the inorganic light emitting element 130. In an embodiment, being a first element on a second element may mean a case that the entire first element is located above the second element, a case that a part of the first element is located on the side of the second element, and a case that the first element surrounds or covers all or part of the second element. In addition, covering the second element with the first element may mean not only a case in which the first element completely covers the second element, but also a case that a part of the second element is exposed by a hole which is formed in the first element.

The first insulating layer 151 may be made of an organic material to provide a flat surface for forming the thin film transistor layer. In addition, the first insulating layer 151 may be made of a transparent material, and it is also possible to prevent the light emitted from the inorganic light emitting element 130 from affecting other sub-pixels by being made of a material that blocks light. In case that the first insulating layer 151 is made of a transparent material, a black matrix (BM) may be disposed between the sub-pixels.

A second buffer layer 122 may be further formed on the first insulating layer 151.

The thin film transistor 140 may be formed on the first insulating layer 151 or the second buffer layer 122. The thin film transistor 140 may include an active layer 141, a gate electrode 143, a drain electrode 144, and a source electrode 145. A gate insulating layer 142 may be formed between the active layer 141 and the gate electrode 143.

The thin film transistor 140 may be one of a low temperature polycrystalline silicon (LTPS) thin film transistor, an oxide thin film transistor, an amorphous Si (a-Si) thin film transistor, and a single crystal thin film transistor.

The active layer 141 may be made of a semiconductive material and include a source region 141*a*, a drain region 141*b*, and a channel region 141*c* between the source region 141*a* and the drain region 141*b*.

The gate electrode 143 may be formed on the active layer 141 to correspond to the channel region 141*c*. The source electrode 145 and the drain electrode 144 may be electrically connected with the source region 141*a* and the drain region 141*b* of the active layer 141, respectively.

In an embodiment, the thin film transistor 140 is implemented as a top gate type in which the gate electrode 143 is formed on the active layer 141. However, the thin film transistor 140 may be implemented as a bottom gate type in which the gate electrode 143 is formed under the active layer 141.

The gate insulating layer 142 made of an inorganic insulating material such as Sio2 may be formed between the active layer 141 and the gate electrode 143, and a second insulating layer 152 and a third insulating layer 153 may be formed on the gate electrode 143.

For example, the source electrode 145 and the drain electrode 144 may be formed on the second insulating layer 152. As described above, the source electrode 145 may be electrically connected with the source region 141*a* of the active layer 141, and the drain electrode 144 may be electrically connected with the drain region 141*b* of the active layer 141.

Accordingly, the source electrode 145 and the drain electrode 144 may be electrically connected with the source region 141*a* and the drain region 141*b* by a contact hole penetrating through the gate insulating layer 142 and the second insulating layer 152, respectively.

An electrode pad 160 for applying a signal to the thin film transistor 140 or the inorganic light emitting element 130 may be formed on the third insulating layer 153. For example, the electrode pad 160 for applying the reference voltage Vss to the cathode 133 of the inorganic light emitting element 130 may be formed on the third insulating layer 153. In an embodiment, an electrode that is electrically connected with the driver IC 200 or an external component of the display panel 100, is used to receive a signal or voltage from the outside or is used for wiring may be referred to as an electrode pad.

The electrode pad 160 may be electrically connected with the cathode 133 of the inorganic light emitting element 130 by a contact hole penetrating through the third insulating layer 153, the second insulating layer 152, the gate insulating layer 142, the second buffer layer 122, and the first insulating layer 151. A reference voltage Vss may be applied to the electrode pad 160 to provide a ground to the inorganic light emitting element 130 connected with the electrode pad 160.

As described above, as the second insulating layer 152 and the third insulating layer 153 are separately formed and the electrodes electrically connected to the inorganic light emitting element 130 and the thin film transistor 140 is formed on different layers, a fan-out wiring may be formed. As a result, the number of driver IC chips may be reduced by using the fan-out wiring.

However, the embodiment of the display device 1 is not limited thereto. It is also possible to further add the number of insulating layers and to provide only the second insulating layer 152 without applying a multilayer structure.

In an embodiment, being electrically connected between two components may include a case that the two components are directly soldered with conductive materials, a case that the two components are connected with a separate wiring, and a case that a layer which flows current, such as an anisotropic conductive film (ACF), is interposed between two components. As long as current which flows between the two components, there is no limitation in the specific connection method.

The thin film transistor 140 shown in FIG. 6 may be the driving transistor 140D configured to drive the inorganic light emitting element 130. Accordingly, the drain electrode 144 of the thin film transistor 140 may be electrically connected with the anode 132 of the inorganic light emitting element 130, and the power supply voltage VDD may be applied to the source electrode 145.

To electrically connect the drain electrode 144 of the thin film transistor 140 with the anode 132 of the inorganic light emitting element 130, a contact hole penetrating through the first insulating layer 151, the second buffer layer 122, the gate insulating layer 142, and the second insulating layer 152 may be formed. The drain electrode 144 of the thin film transistor 140 and the anode 132 of the inorganic light emitting element 130 may be electrically connected by the contact hole.

Although not shown in the drawings, the source electrode 145 may be connected with the power line VL to which the power voltage VDD is supplied, and the gate electrode 143 may be connected with the data line DL to which the data voltage $V_{DATA}$ is supplied.

According to the above-described structure, various circuit elements including the thin film transistor 140 may be disposed on the opposite side of the light emitting surface of the inorganic light emitting element 130. Therefore, the circuit elements may not affect the light emitting region of the inorganic light emitting element 130, and a structure in which the inorganic light emitting element 130 and the thin film transistor 140 are vertically stacked may be possible.

Stacking in the vertical direction may mean that at least a portion of the thin film transistor 140 overlaps with at least a portion of the inorganic light emitting element 130 when viewed from the YZ plane in which the inorganic light emitting element 130 and the thin film transistor 140 are disposed. Depending on the arrangement, stacking in the vertical direction may mean that the thin film transistor 140 and the inorganic light emitting element 130 may share a central axis. However, stacking in the vertical direction does not necessarily require sharing of the central axis. As long as at least a portion of the thin film transistor 140 and at least a portion of the inorganic light emitting element 130 are stacked to overlap with each other, it may be determined that the thin film transistor 140 and the inorganic light emitting element 130 are stacked in the vertical direction regardless of the sharing of the central axis.

In case that the inorganic light emitting element 130 and the thin film transistor 140 are vertically stacked, a pixel area may be reduced, and the constraint due to the pixel area may be eliminated in realizing high resolution.

In addition, because the thin film transistor 140 is formed in the direction opposite to the light emitting surface of the inorganic light emitting element 130, the light emitted from the inorganic light emitting element 130 is not diffusely reflected on the thin film transistor 140 and smudges are not generated on the screen Accordingly, the display device 1 according to an embodiment of the present disclosure may have the advantages of the bottom emission type and prevent the difficulty caused by the thin film transistor being positioned in the emission direction of the light emitting element.

Figure 7:
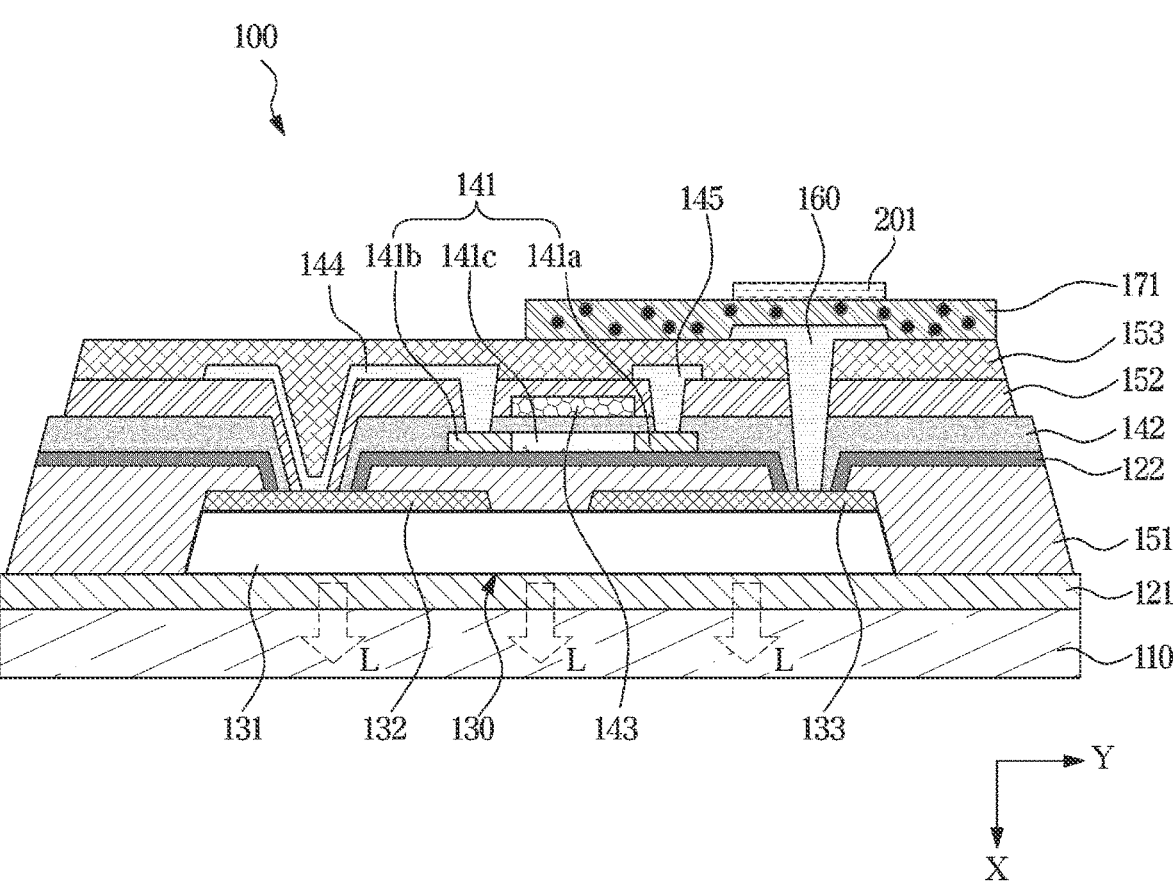
FIGS. 7 and 8 are diagrams illustrating an example of a method in which the display panel of the display device is electrically connected with a driver integrated circuit (IC) according to an embodiment of the present disclosure.
Figure 8:
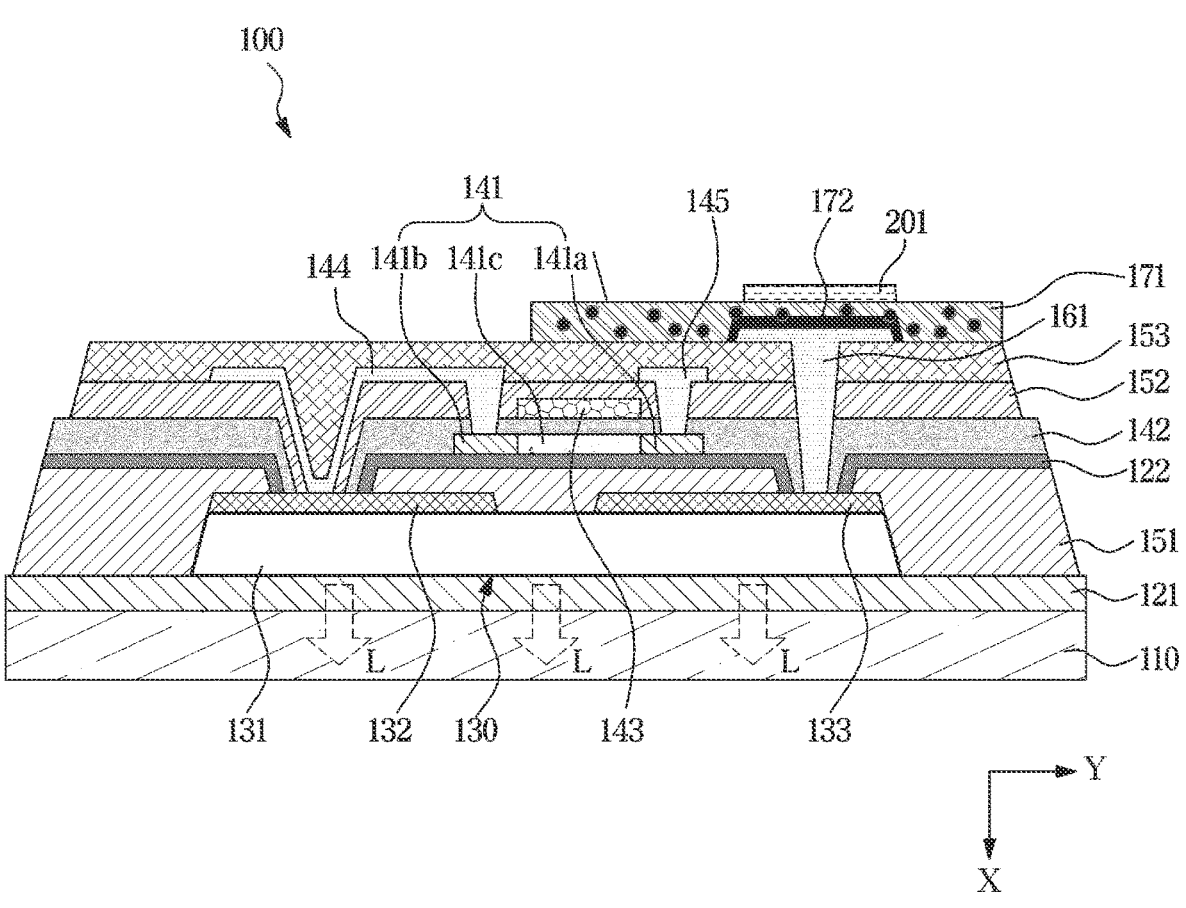

FIGS. 7 and 8 are diagrams illustrating an example of a method in which the display panel of the display device is electrically connected with a driver integrated circuit (IC) according to an embodiment of the present disclosure.

For example, the display device 1 may be electrically connected with the driver IC 200 by using FOG bonding. In this case, the electrode pad 160 formed on the second insulating layer 152 or the third insulating layer 153 may be electrically connected with a film 201 on which the driver IC 200 is mounted.

Referring to the example of FIG. 7, an anisotropic conductive film (ACF) 171 may be disposed on the electrode pad 160. The anisotropic conductive film 171 is manufactured in the form of a film by uniformly dispersing conductive particles in an adhesive organic material having insulation properties. The anisotropic conductive film 171 has conductivity in the thickness direction of the film and insulation in the plane direction.

When heat is applied to the anisotropic conductive film 171 and a portion of the film 201 on which the driver IC 200 is mounted is pressed, a current may flow in the direction to which the pressure is applied. Accordingly, the driver IC 200 and the electrode pad 160 may be electrically connected.

As shown in FIG. 8, a capping layer 172 may be provided on the electrode pad 160. The capping layer 172 may prevent oxidation when the electrode or wiring is exposed and be formed of a conductor such as indium tin oxide (ITO).

Figure 9:
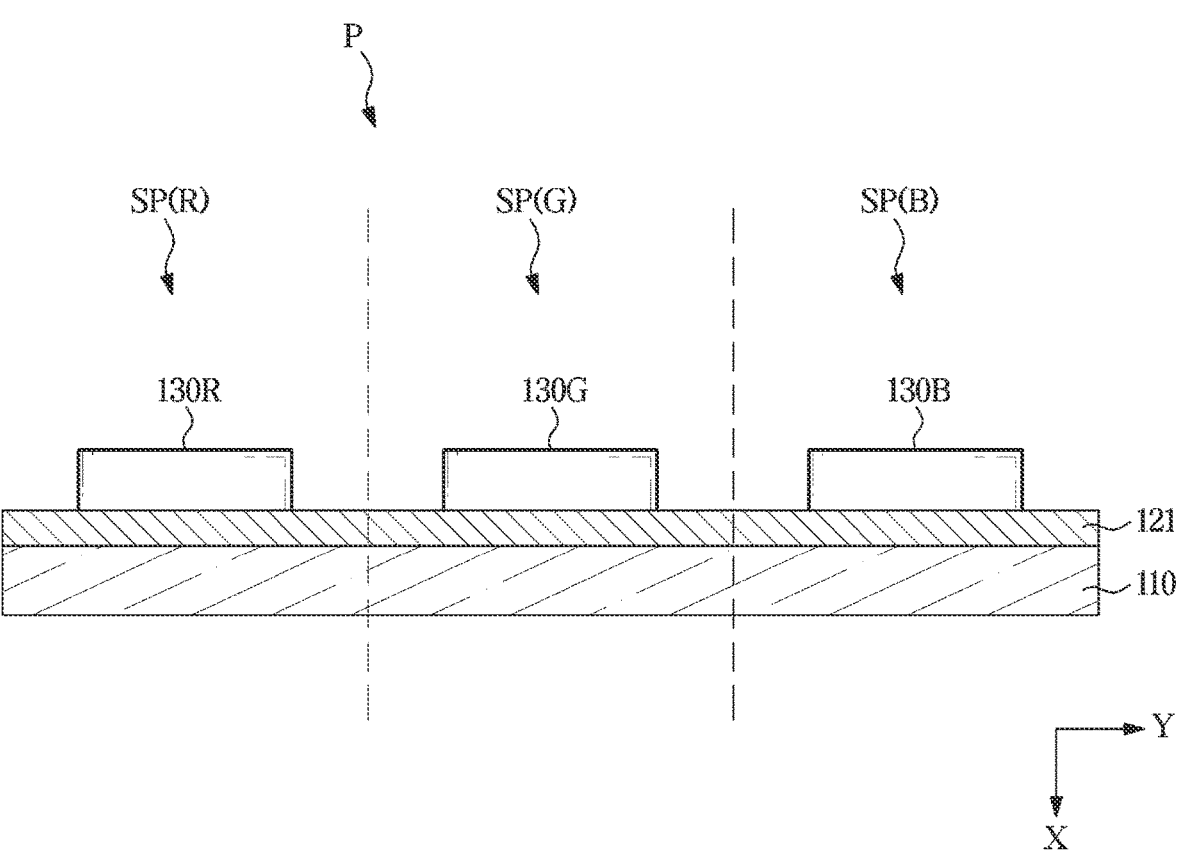
FIG. 9 is a diagram illustrating a configuration of a single pixel in the display device according to an embodiment of the present disclosure.
Figure 10:
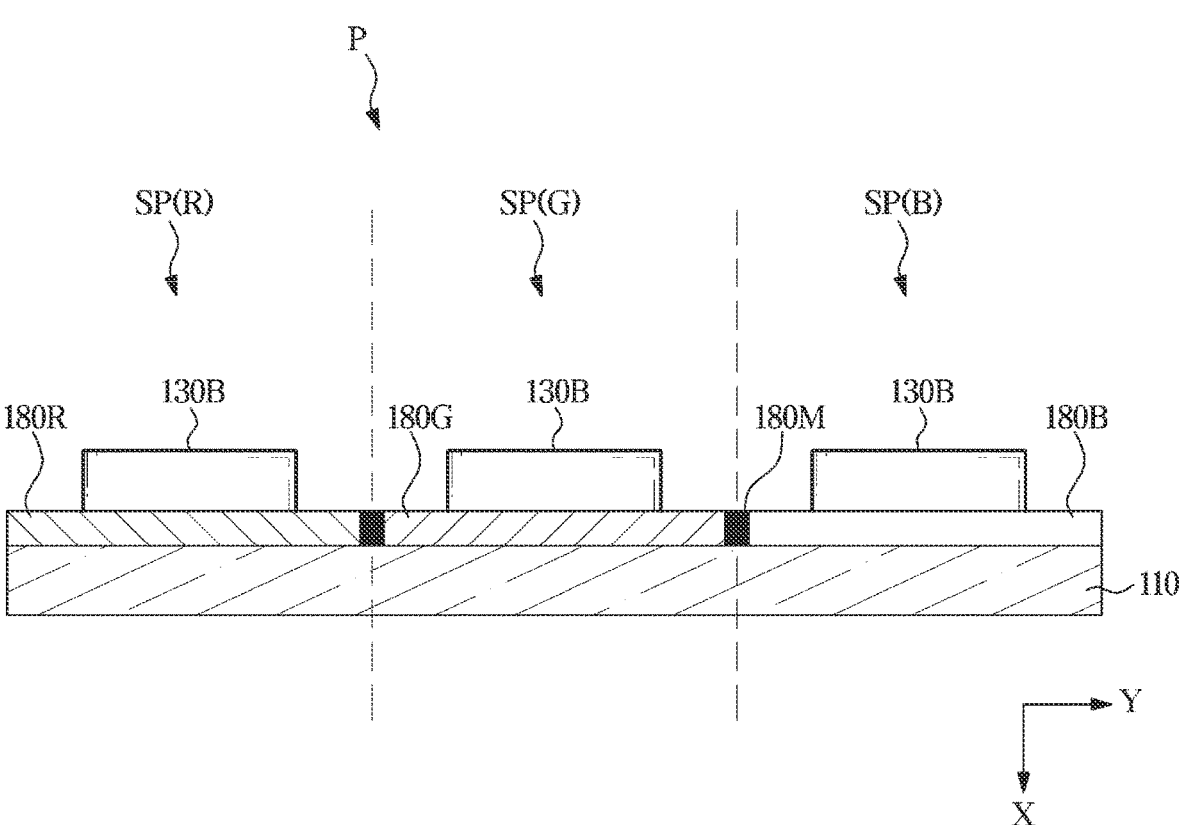
FIG. 10 is a diagram illustrating a configuration of a single pixel in case that the display device further includes a color conversion layer according to an embodiment of the present disclosure.
Figure 11:
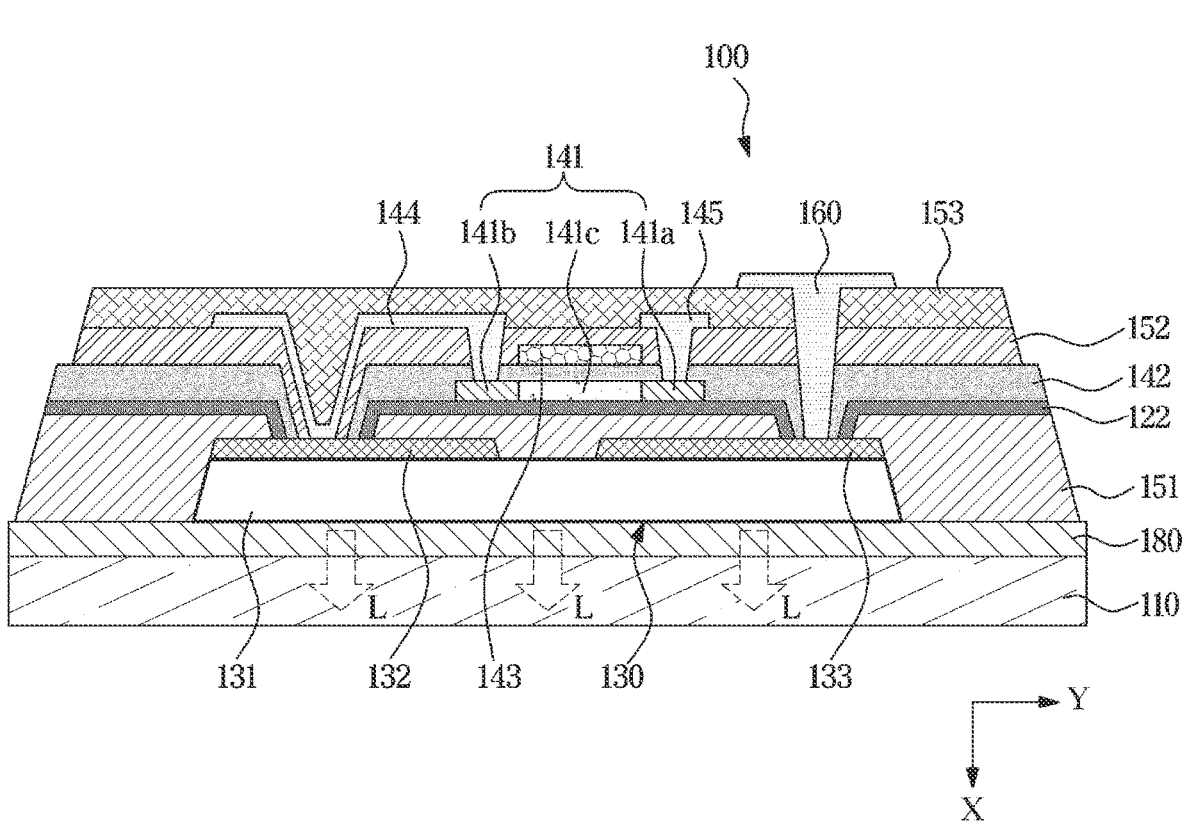
FIG. 11 is a cross-sectional view of the single sub-pixel in case that the display device further includes the color conversion layer according to an embodiment of the present disclosure.

FIG. 9 is a diagram illustrating a configuration of a single pixel in the display device according to an embodiment of the present disclosure. FIG. 10 is a diagram illustrating a configuration of a single pixel in case that the display device further includes a color conversion layer according to an embodiment of the present disclosure. FIG. 11 is a cross-sectional view of the single sub-pixel in case that the display device further includes the color conversion layer according to an embodiment of the present disclosure.

The above-described structure is a structure corresponding to a single sub-pixel. As shown in FIG. 9, the sub-pixel on which the red light emitting element 130R is disposed becomes the red sub-pixel SP(R). The sub-pixel on which the green light emitting element 130G is disposed becomes the green sub-pixel SP(G). The sub-pixel in which the blue light emitting element 130B is disposed becomes the blue sub-pixel SP(B). The red sub-pixel SP(R), the green sub-pixel SP(G), and the blue sub-pixel SP(B) disposed adjacent to each other may constitute one single pixel P.

As another example, it may be also possible to arrange the inorganic light emitting element emitting the light of the same color in the red sub-pixel SP(R), the green sub-pixel SP(G), and the blue sub-pixel SP(B).

For example, as shown in FIGS. 10 and 11, the blue light emitting element 130B may be arranged in the red sub-pixel SP(R), the green sub-pixel SP(G), and the blue sub-pixel SP(B), and it is also possible to form a color conversion layer 180 between the blue light emitting element 130B and the transparent substrate 110. Alternatively, it is also possible to arrange a white light emitting element. The white light emitting element may be implemented by combining a blue LED and a yellow phosphor or a blue LED and red and green phosphors.

A material for converting blue light into red light may be included in a red region 180R positioned in the red sub-pixel SP(R). For example, a red quantum dots converting blue light into red light may be included in the red region 180R.

A material converting blue light into green light may be included in a green region 180G positioned in the green sub-pixel SP(G). For example, green quantum dots converting blue light into green light may be included in the green region 180G.

Because the blue light emitting element 130B emits blue light in the blue sub-pixel SP(B), a color conversion material is not included in a blue region 180B positioned in the blue sub-pixel SP(B). The blue region 180B may be empty or scattering particles for scattering blue light emitted from the blue light emitting device 130B may be included in the blue region 180B. In case that scattering particles are included in the blue region 180B, the diffused blue light may be emitted while the incident blue light is scattered. Due to this structure, the blue sub-pixel may have superior color viewing angle and light output efficiency in comparison with other sub-pixels.

Scattering particles may be material such as zinc oxide, titanium oxide, silicon oxide, or the like. These materials may be distributed in the blue region 180B in an arbitrary or a predefined pattern.

The light emitting element 130B disposed in each sub-pixel may be implemented to have an area smaller than the areas of the red region 180R, the green region 180G, and the blue region 180B, thereby preventing an effect on the adjacent sub-pixels. Also, a black matrix 180M for preventing inter-subpixel interference described above may be provided at a boundary of the red region 180R, the green region 180G, and the blue region 180B.

In the above example, the case of using quantum dots as the color conversion material is exemplified, but it may be also possible to use phosphors in addition to quantum dots. There is no limitation in a material that converts the color of the light emitted from the inorganic light emitting element 130.

In case that the color conversion layer 180 is formed between the transparent substrate 110 and the inorganic light emitting element 130, the first buffer layer 121 may be omitted.

Hereinafter a method of manufacturing the display device according to an embodiment of the present disclosure will be described. The display device manufactured by the method of manufacturing the display device according to an embodiment of the present disclosure may be the display device 1 according to the above-described embodiments. Accordingly, the structure of the display device 1 described above with reference to FIGS. 1 to 11 may be applied to the embodiment of a method of manufacturing a display device to be described later, even if there is no separate mention. Conversely, a description of the method of manufacturing the display device, which will be described later, may be also applicable to the embodiment of the display device 1.

In the embodiments to be described below, forming a second component on a first component may include a case in which there is no third component between the first component and the second component and another case in which there is a third component between components. That is, it may include a case in which the second component is formed on the first component and another case in which second component is formed on the first component on which the third component is formed.

Figure 12:
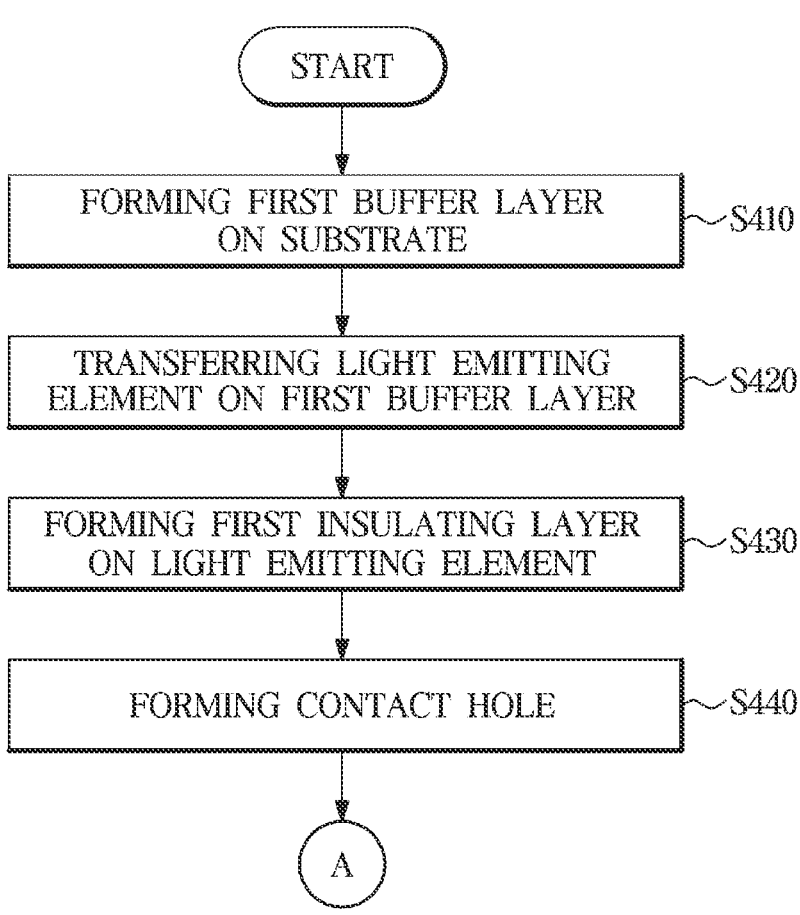
FIG. 12 is a flowchart illustrating some processes of a method of manufacturing the display device according to an embodiment of the present disclosure.
Figure 13:
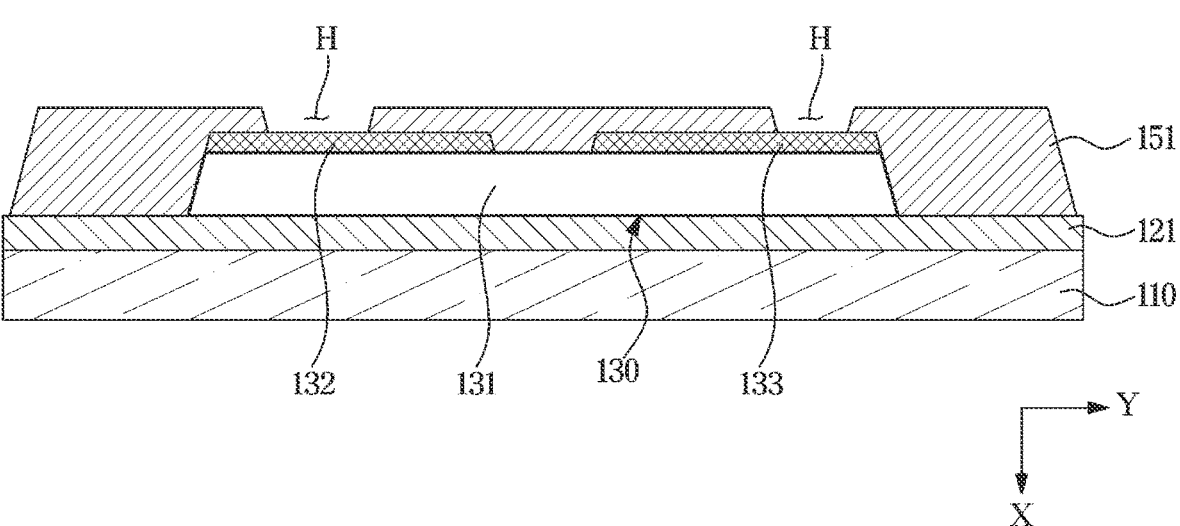
FIG. 13 is a cross-sectional view illustrating the display device manufactured by the process according to the flowchart of FIG. 12 according to an embodiment of the present disclosure.

FIG. 12 is a flowchart illustrating some processes of a method of manufacturing the display device according to an embodiment of the present disclosure. FIG. 13 is a cross-sectional view illustrating the display device manufactured by the process according to the flowchart of FIG. 12 according to an embodiment of the present disclosure.

Referring to FIG. 12, in operation S410, the first buffer layer 121 for planarization is formed on the transparent substrate 110. The first buffer layer 121 may be formed by depositing an inorganic material or an organic material on the transparent substrate 110. The inorganic material may include silicon oxide, silicon nitride, silicon oxynitride, aluminum oxide, aluminum nitride, titanium oxide, and titanium nitride, and the organic material may include poly-imide, polyester, and acrylic.

As shown in FIGS. 10 and 11, it may be also possible to form the color conversion layer 180 instead of or in addition to the first buffer layer 121.

In operation S420, The inorganic light emitting element 130 is transferred on the first buffer layer 121.

As described above, the inorganic light emitting element 130 may be a micro-LED. After the micro-LED on the wafer or temporary substrate is picked up by a transfer mechanism, the micro-LED may be transferred on the transparent substrate 110 on which the first buffer layer 121 or the color conversion layer 180 is formed. The inorganic light emitting element 130 may be transferred in such a way that the light emitting surface faces the transparent substrate 110 and the anode 132 and the cathode 133 face upward. The transfer method may be employed any of known techniques such as a method using a laser or a method using a stamp.

To fix the inorganic light emitting element 130, an adhesive material for adhesion of the inorganic light emitting element 130 may be included in the first buffer layer 121, and it may be also possible to form a groove by pressing the inorganic light emitting element 130 on the first buffer layer 121.

In case that the color conversion layer 180 is not formed, the red inorganic light emitting element, the green inorganic light emitting element, and the blue inorganic light emitting element may be transferred for each sub-pixel. In case that the color conversion layer 180 is formed, the blue inorganic light emitting elements may be transferred to each sub-pixel. The inorganic light emitting elements constituting one pixel may be transferred to positions adjacent to each other.

In operation S430, after the inorganic light emitting element 130 is transferred onto the transparent substrate 110, the first insulating layer 151 is formed thereon. Forming the first insulating layer 151 on the inorganic light emitting element 130 may mean forming the first insulating layer 151 on the transparent substrate 110 to which the inorganic light emitting element 130 is transferred. The formed first insulating layer 151 may cover the transparent substrate 110 and the inorganic light emitting element 130.

The first insulating layer 151 made of an organic material may be deposited on the transparent substrate 110, on which the inorganic light emitting element 130 is disposed, to provide a flat surface.

In operation S440, after the first insulating layer 151 is formed, a contact hole H for electrically connecting the anode 132 and the cathode 133 of the inorganic light emitting element 130 with the thin film transistor 140 and the electrode pad 160 is formed. To form the contact hole H, a portion of the first insulating layer 151 covering the anode 132 and the cathode 133 of the inorganic light emitting element 130 may be etched.

In case that the formation of the contact hole H is completed, a single sub-pixel of the display panel 100 may include a structure as shown in FIG. 13.

FIG. 14 is a flowchart illustrating another partial process of the method of manufacturing the display device according to an embodiment of the present disclosure. FIG. 15 is a cross-sectional view illustrating the display device manufactured by the process according to the flowchart of FIG. 14 according to an embodiment of the present disclosure.

Referring to FIG. 14, in operation S510, the second buffer layer 122 is formed on the first insulating layer 151. The second buffer layer 122 may be formed by depositing an organic or an inorganic material constituting the second buffer layer 122 on the first insulating layer 151.

The thin film transistor 140 may be formed on the second buffer layer 122. The thin film transistor 140 may be a LTPS thin film transistor or an oxide thin film transistor. In addition, the thin film transistor 140 may be an a-Si thin film transistor or a single crystal thin film transistor. However, in an embodiment, a case in which the thin film transistor 140 is an LTPS thin film transistor will be described as an example for detailed description.

In operation S520, to form the thin film transistor 140, the active layer 141 is formed on the second buffer layer 122.

To form the active layer 141, first, a-Si may be deposited and then heat-treated to remove hydrogen contained in the a-Si. Next, poly-Si may be made by an excimer laser annealing (ELA) process in which a-Si is crystallized using a laser after hydrogen is removed. Finally, when Poly-Si is formed, the active layer 141 may be formed by etching the Poly-Si into a designed shape by a patterning process.

In operation S530, the gate insulating layer 142 is formed on the active layer 141.

Forming the gate insulating layer 142 on the active layer 141 may include a case in which the gate insulating layer 142 is formed on the second buffer layer 122 on which the active layer 141 is formed. The gate insulating layer 142 formed on the second buffer layer 122 on which the active layer 141 is formed may cover the active layer 141 and the second buffer layer 122.

The gate insulating layer 142 may be formed by depositing an inorganic insulating material such as Sio2, which forms the gate insulating layer 142, on the second buffer layer 122 on which the active layer 141 is formed.

In operation S540, the gate electrode 143 is formed on the gate insulating layer 142.

For this, a metal such as copper, aluminum, molybdenum used as a material of the gate electrode 143 may be deposited on the gate insulating layer 142 and etched into a designed shape. For the deposition of metal, a sputtering process may be used.

After the gate electrode 143 is formed, the active layer 141 may be doped by an ion implantation process. After the ions are implanted, an ionic activation process, which the active layer 141 is heated to evenly spread the implanted ions in poly-Si, may be performed.

In operation S550, the second insulating layer 152 is formed on the gate electrode 143.

Forming the second insulating layer 152 on the gate electrode 143 may mean forming the second insulating layer 152 on the gate insulating layer 142 on which the gate electrode 143 is formed. The second insulating layer 152 formed on the gate insulating layer 142 on which the gate electrode 143 is formed may cover the gate insulating layer 142 and the gate electrode 143.

The second insulating layer 152 may be formed by depositing a material serving as a material of the second insulating layer 152 on the gate insulating layer 142 on which the gate electrode 143 is formed.

The material of the second insulating layer 152 may vary depending on the type of the thin film transistor 140. In the case of forming the LTPS thin film transistor as an example of the disclosure, the second insulating layer 152 formed between the gate electrode 143, the drain electrode 144, and the source electrode 145 may be formed of an inter-layer dielectric (ILD). The ILD may separate the gate line and the data line and protect the thin film transistor 140. For example, SiNx and SiOx may be used as a material of the second insulating layer 152. SiNx contains a large amount of hydrogen, and the large amount of hydrogen is attached to silicon dangling bonds in the LTPS thin film and may serve to lower the defect density.

In operation S560, after forming the second insulating layer 152, a contact hole H for electrically connecting the source electrode 145 and the drain electrode 144 with the active layer 141 is formed. The second buffer layer 122, the gate insulating layer 142, and the second insulating layer 152 may be simultaneously etched to form the contact hole H.

In detail, the second insulating layer 152 and the gate insulating layer 142 may be etched to expose a portion of the source region 141a and the drain region 141b of the active layer 141. A position, which corresponds to the anode 132, in the second insulating layer 152, the gate insulating layer 142, and the second buffer layer 122 may be etched to expose a portion of the anode 132 of the inorganic light emitting element 130.

When the above-described contact hole H is formed, a single sub-pixel of the display panel 100 may include a structure in which the thin film transistor 140 is vertically stacked on the inorganic light emitting element 130 as shown in FIG. 15.

FIG. 16 is a flowchart illustrating another partial process of the method of manufacturing the display device according to an embodiment of the present disclosure. FIG. 17 is a cross-sectional view illustrating the display device manufactured by the process according to the flowchart of FIG. 16 according to an embodiment of the present disclosure In case that the contact hole H for electrical connection with the source electrode 145 and the drain electrode 144 is formed, as shown in FIG. 16, in operation S610, the source electrode 145 and the drain electrode 144 may be formed on the second insulating layer 152.

For this, a metal such as copper, aluminum, or molybdenum, which is a material of the source electrode 145 and the drain electrode 144, may be deposited on the second insulating layer 152 and etched into a designed shape.

Prior to forming the source electrode 145 and the drain electrode 144, a portion of the source region 141a and the drain region 141b may be exposed because a contact hole H is formed at a position corresponding to the source region 141a and the drain region 141b. Accordingly, the source electrode 145 and the drain electrode 144 deposited on the second insulating layer 152 may be electrically connected with the source region 141a and the drain region 141b by the contact hole H, respectively.

In addition, because a portion of the anode 132 of the inorganic light emitting element 130 is exposed by forming the contact hole H in the above-described operation S560, the drain electrode 144 of the thin film transistor 140 may be electrically connected with the anode 132 of the inorganic light emitting element 130 by the contact hole H. There is no need to extend the drain electrode 144 to form a connection bridge or to add a separate connection electrode because the at least a portion of the thin film transistor 140 is formed to partially overlap with the inorganic light emitting element 130.

In operation S620, the third insulating layer 153 is formed on the source electrode 145 and the drain electrode 144.

Forming the third insulating layer 153 on the source electrode 145 and the drain electrode 144 may mean a case that the third insulating layer 153 is formed on the second insulating layer 152 on which the source electrode 145 and the drain electrode 144 are formed. The formed third insulating layer 153 may cover the source electrode 145, the drain electrode 144, and the second insulating layer 152.

The third insulating layer 153 may be formed by depositing a material serving as a material of the third insulating layer 153 on the second insulating layer 152 in which the source electrode 145 and the drain electrode 144 are formed. The material of the third insulating layer 153 may be the same as the material usable for the second insulating layer 152.

As described above, the separate third insulating layer 153 may be formed to provide a fan-out wiring for applying a multilayer structure. Accordingly, in case that the fan-out wiring is not applied, the electrode pad 160, the source electrode 145, and the drain electrode 144 may be formed on the same layer without forming the third insulating layer 153.

After the third insulating layer 153 is formed, a position, which corresponds to the cathode 133, in the third insulating layer 153, the second insulating layer 152, the gate insulating layer 142, and the second buffer layer 122 may be simultaneously etched so as to form a contact hole H for electrical connection between the electrode pad 160 and the cathode 133, in operation S630.

In case that the contact hole H is formed, a single sub-pixel of the display panel 100 may have a structure as shown in FIG. 17.

FIG. 18 is a flowchart illustrating another partial process of the method of manufacturing the display device according to an embodiment of the present disclosure.

In operation S710, in case that the contact hole H for connecting the electrode pad 160 is formed, as shown in FIG. 18, the electrode pad 160 is formed on the third insulating layer 153.

For this, a metal such as copper, aluminum, molybdenum, used as a material of the electrode pad 160 may be deposited on the third insulating layer 153 and etched into a designed shape.

Before forming the electrode pad 160, a portion of the cathode 133 is exposed because a contact hole H is formed at the location of the cathode 133 of the inorganic light emitting element 130. Accordingly, the electrode pad 160 deposited on the third insulating layer 153 may be electrically connected with the cathode 133 of the inorganic light emitting element 130 by the contact hole H.

In operation S720, the anisotropic conductive film 171 is formed on the electrode pad 160.

For example, the anisotropic conductive film 171 may be formed by dispersing conductive particles to an insulating adhesive resin and then applying the insulating adhesive resin, in which the conductive particles are dispersed, on the electrode pad 160.

In operation S730, after the anisotropic conductive film 171 is formed, the electrode pad 160 and the driver IC 200 may be electrically connected by the anisotropic conductive film 171.

As described above, in case that the driver IC 200 in the form of being mounted on the film 201 is bonded to the display panel 100, by pressing the film 201, on which the driver IC 200 is mounted, to the heated anisotropic conductive film 171, the driver IC 200 and the electrode pad 160 may be electrically connected.

When the electrical connection with the driver IC 200 is completed, a single sub-pixel of the display panel 100 may have a structure as illustrated in FIG. 7 described above. In addition, when the capping layer 172 is formed to prevent oxidation of the electrode pad 160, a single sub-pixel of the display panel 100 may include a structure as shown in FIG. 8 described above.

The method described with reference to FIGS. 12 to 18 is only an example of a method of manufacturing a display device according to an embodiment of the disclosure. If it is a method of transferring the light emitting surface of the inorganic light emitting element 130 to face the transparent substrate 110 and forming the thin film transistor 140 on the inorganic light emitting element 130, even if some of the above-described processes are omitted, changed and another process is added, it may be included in the scope of the method of manufacturing the display device according to an embodiment of the present disclosure.

A display device and a manufacturing method thereof may reduce a pixel size and easily realize a high resolution in the same screen size by maximizing a light emitting area.

While example embodiments of the present disclosure has been particularly described, it should be understood by those of skilled in the art that various changes in form and details may be made without departing from the spirit and scope of the present disclosure.

What is claimed is:

1. A display device comprising:
   a display panel comprising:
   a transparent substrate;
   an inorganic light emitting element provided on the transparent substrate and configured to emit a light toward the transparent substrate, the inorganic light emitting element comprising a light emitting surface facing the transparent substrate and a first electrode on a surface of the inorganic light emitting element that is opposite to the light emitting surface;
   a first insulating layer provided on the inorganic light emitting element;
   a thin film transistor provided on the first insulating layer, the thin film transistor comprising a gate electrode, a source electrode, and a drain electrode;
   a second insulating layer between the gate electrode, the source electrode, and the drain electrode;
   a third insulating layer provided on the second insulating layer; and
   an electrode pad directly contacting a portion of the first electrode by a contact hole penetrating the third insulating layer, the portion of the first electrode being directly above the inorganic light emitting element; and
   a driver integrated circuit (IC) configured to drive the display panel and connected to the electrode pad,
   wherein at least a portion of the thin film transistor overlaps at least a portion of the inorganic light emitting element.

2. The display device of claim 1, further comprising a first buffer layer between the transparent substrate and the inorganic light emitting element, the first buffer layer comprising an adhesive material.

3. The display device of claim 2, wherein the inorganic light emitting element comprises:
   a second electrode facing the first insulating layer in a direction opposite to a light emitting direction of the light emitting surface.

4. The display device of claim 3, wherein the driver IC is provided on the display panel in the direction opposite to the light emitting surface.

5. The display device of claim 1, wherein the portion of the thin film transistor overlaps the portion of the inorganic light emitting element on a plane on which the transparent substrate is provided.

6. The display device of claim 1, wherein the display panel further comprises a plurality of pixels arranged in two dimensions, and
   wherein each of the plurality of pixels comprises at least three sub-pixels, and each of the at least three sub-pixels is configured to emit light of a color different from colors of light emitted from others of the at least three sub-pixels.

7. The display device of claim 6, wherein the at least three sub-pixels comprise a red sub-pixel, a green sub-pixel, and a blue sub-pixel,
   wherein the red sub-pixel among the at least three sub-pixels comprises a red inorganic light emitting element configured to emit red light;
   wherein the green sub-pixel among the at least three sub-pixels comprises a green inorganic light emitting element configured to emit green light; and
   wherein the blue sub-pixel among the at least three sub-pixels comprises a blue inorganic light emitting element configured to emit blue light.

8. The display device of claim 6, wherein each of the at least three sub-pixels comprises an inorganic light emitting element emitting light of a same color, and wherein the display device further comprises a color conversion layer between the transparent substrate and the inorganic light emitting element.

9. The display device of claim 1, wherein the thin film transistor comprises a low temperature polycrystalline silicon (LTPS) thin film transistor, and wherein the second insulating layer comprises an interlayer dielectric (ILD).

10. The display device of claim 1, wherein the contact hole penetrates the third insulating layer.

11. A manufacturing method for a display device, the method comprising:

transferring an inorganic light emitting element onto a transparent substrate, the inorganic light emitting element comprising a light emitting surface facing the transparent substrate and a first electrode on a surface of the inorganic light emitting element that is opposite to the light emitting surface;

forming a first insulating layer on the inorganic light emitting element;

forming a thin film transistor on the first insulating layer so that at least a portion of the thin film transistor overlaps at least a portion of the inorganic light emitting element, the thin film transistor being connected with the inorganic light emitting element by a first contact hole penetrating through the first insulating layer, the thin film transistor comprising a gate electrode, a source electrode, and a drain electrode;

forming a second insulating layer between the gate electrode, the source electrode, and the drain electrode;

forming a third insulating layer provided on the second insulating layer; and forming an electrode pad, the electrode pad being connected with the inorganic light emitting element by directly contacting a portion of the first electrode by a second contact hole penetrating the first insulating layer, and the portion of the first electrode being directly above the inorganic light emitting element.

12. The manufacturing method of claim 11, wherein the transferring the inorganic light emitting element onto the transparent substrate comprises forming a first buffer layer comprising an adhesive material on the transparent substrate so that the inorganic light emitting element is transferred onto the transparent substrate on which the first buffer layer is formed.

13. The manufacturing method of claim 11, wherein the transferring the inorganic light emitting element onto the transparent substrate comprises transferring the inorganic light emitting element so that the light emitting surface of the inorganic light emitting element faces the transparent substrate and the first electrode of the inorganic light emitting element faces the first insulating layer.

* * * * *